United States Patent
Merryman et al.

(12) 
(10) Patent No.: US 6,708,144 B1
(45) Date of Patent: Mar. 16, 2004

(54) SPREADSHEET DRIVEN I/O BUFFER SYNTHESIS PROCESS

(75) Inventors: Kenneth E. Merryman, Fridley, MN (US); Ronald G. Arnold, Apple Valley, MN (US)

(73) Assignee: Unisys Corporation, Blue Bell, PA (US)

( * ) Notice: Subject to any disclaimer, the term of this patent is extended or adjusted under 35 U.S.C. 154(b) by 1,060 days.

(21) Appl. No.: 08/789,001

(22) Filed: Jan. 27, 1997

(51) Int. Cl.[7] ............................. G06F 9/45; G06F 17/50
(52) U.S. Cl. ................................ 703/14; 716/8; 716/9; 716/10; 716/11; 716/12; 716/13; 716/14
(58) Field of Search ................................. 364/488, 489, 364/490, 491; 716/8–14; 703/14

(56) References Cited

U.S. PATENT DOCUMENTS

| | | | |
|---|---|---|---|
| 4,758,953 A | | 7/1988 | Morita et al. |
| 4,831,543 A | | 5/1989 | Mastellone |
| 4,918,614 A | | 4/1990 | Modarres et al. |
| 4,967,367 A | * | 10/1990 | Piednoir ..................... 364/489 |
| 5,050,091 A | | 9/1991 | Rubin |
| 5,164,908 A | | 11/1992 | Igarashi |
| 5,175,696 A | | 12/1992 | Hooper et al. |
| 5,222,029 A | | 6/1993 | Hooper et al. |
| 5,231,589 A | * | 7/1993 | Itoh et al. .................... 364/490 |
| 5,255,363 A | | 10/1993 | Seyler |
| 5,258,919 A | * | 11/1993 | Yamanouchi et al. ....... 364/489 |
| 5,267,175 A | | 11/1993 | Hooper |
| 5,341,309 A | | 8/1994 | Kawata |
| 5,349,659 A | | 9/1994 | Do et al. |
| 5,355,317 A | | 10/1994 | Talbott et al. |
| 5,357,440 A | | 10/1994 | Talbott et al. |
| 5,359,523 A | | 10/1994 | Talbott et al. |
| 5,359,537 A | | 10/1994 | Saucier et al. |
| 5,361,357 A | | 11/1994 | Kionka |
| 5,398,195 A | | 3/1995 | Kim |
| 5,402,358 A | * | 3/1995 | Smith et al. ................. 364/490 |
| 5,406,497 A | | 4/1995 | Altheimer et al. |
| 5,416,721 A | | 5/1995 | Nishiyama et al. |
| 5,418,733 A | | 5/1995 | Kamijima |
| 5,418,954 A | | 5/1995 | Petrus |
| 5,440,720 A | | 8/1995 | Baisuck et al. |
| 5,483,461 A | | 1/1996 | Lee et al. |
| 5,485,396 A | | 1/1996 | Brasen et al. |
| 5,490,266 A | | 2/1996 | Sturges |
| 5,490,268 A | | 2/1996 | Matsunaga |
| 5,491,640 A | | 2/1996 | Sharma et al. |
| 5,493,508 A | | 2/1996 | Dangelo et al. |
| 5,544,088 A | * | 8/1996 | Aubertine et al. .......... 364/489 |
| 5,610,833 A | * | 3/1997 | Chang et al. ................ 364/491 |

OTHER PUBLICATIONS

Tufte, "CML III Bipolar Standard Cell Library", Proceedings of the 1988 Bipolar Circuits and Technology Meeting, Minneapolis, Minnesota, Sep., 1988, pp. 180–182.

* cited by examiner

Primary Examiner—Hugh Jones
(74) Attorney, Agent, or Firm—Charles A. Johnson; Mark T. Starr; Nawrocki, Rooney & Sivertson, P.A.

(57) ABSTRACT

The present invention relates to a method and apparatus for efficiently managing the I/O design of an integrated circuit. The present invention automatically selects and interconnects a number of I/O cells selected from a design library to form an I/O interface. A user interface is provided for receiving a number of parameters provided by the circuit designer. The parameters preferably provide specific information about a circuit design. A set of circuit design assembly rules are also provided, which define the available I/O cells and the appropriate interconnections of the available I/O cells. A computer program then selects and assembles the I/O cells in accordance with the user provided parameters and the set of circuit design assembly rules.

35 Claims, 7 Drawing Sheets

SPREADSHEET DRIVEN I/O BUFFER SYNTHESIS PROCESS

BACKGROUND OF THE INVENTION

1. Field of the Invention

The present invention relates to a method and apparatus for efficiently designing a circuit design, and more particularly, to a method and apparatus for selecting input, output, and/or bi-directional buffers from a component library, and interconnecting the components automatically in accordance with a set of circuit design assembly rules.

2. Description of the Prior Art

Custom and semi-custom integrated circuit designs, such as Application Specific Integrated Circuits (ASICs), are typically designed by assembling predefined components or macro cells selected from a design library. The use of predefined components is often desirable to expedite the design process because many similar components may be used throughout the circuit design. The components or macro cells are often designed to accommodate a variety of drive strength and control applications. For example, a particular output buffer may be selected from a variety of output macro cells, each having a different drive strength characteristic. This may be desirable because the resistive and/or capacitive load may be different for a selected output pin. Further, some of the I/O may be in critical timing paths, and thus it may be desirable to optimize the output drive of these I/O to maximize the performance of the timing path.

Interconnecting input, output, and bi-directional buffers can be time consuming and tedious, particularly if boundary scan or other test structures are included in the circuit design. For board testing purposes, it is common to provide a boundary scan path that includes each I/O buffer of an integrated circuit. This may allow each of the I/O pads of the integrated circuit to be both controllable and observable, and may help isolate an error to a particular integrated circuit on the board, or to a particular trace on the board.

To provide boundary scan, the I/O buffers typically must have special test logic included therein. The test logic that is required often depends on the type of buffer, the type of boundary scan desired and the desired test format. Further, each of the I/O buffers that are included in the boundary scan path typically must be serially connected into a serial scan chain. Finally, a number of control signals must typically be provided to each I/O buffer in the boundary scan path.

In some designs, it may be desirable to support more than one test format. For example, some designs may support both the Test Access Port (TAP) format and the Level Sensitive Scan Design (LSSD). To implement the TAP and LSSD format boundary scan, the I/O buffers are typically required to be connected to both the TAP and LSSD scan logic, and may require unique control signals and interconnect requirements for each format. Supporting both TAP and LSSD often places a great burden on the circuit designer to manage the necessary control and test logic associated with either or both of the TAP and LSSD boundary scan formats.

Another factor which often complicates the I/O design of an integrated circuit is that the I/O pads may function differently depending on whether the integrated circuit is in a test mode or a functional mode. This may be desirable when the integrated circuit is pin limited. For example, selected output pins may be designated as inputs when in test mode, and outputs when in functional mode.

Finally, the design of the I/O section of an integrated circuit design may be complicated by the variety of I/O buffer attributes that may be required. As indicated above, some I/O pads on the die may drive higher resistance and/or capacitance than other pads. Further, some I/O buffers may be in critical timing paths, while other may not. Thus, in this example, the drive strength of each I/O buffer on the die may have to be selected to optimized the speed/power product of the overall design.

As can readily be seen, managing the I/O design, testability, and boundary scan requirements on a modern integrated circuit can be a difficult, time consuming and error prone endeavor. In addition, it is known that design changes are often required during the design process, which may result in input and output signals being reassigned to different pins, attributes of particular I/O buffers being changed, and/or the testability requirements of particular I/O buffers being change. These design changes may necessitate reconnecting large portions of the input, output, and bi-directional buffer interface logic and boundary scan logic, which may add to the difficult in managing the I/O design.

SUMMARY OF THE INVENTION

The present invention overcomes the many of the disadvantages found in the prior art by providing a method and apparatus for efficiently managing the I/O design of an integrated circuit. The present invention automatically selects and interconnects a number of I/O cells selected from a design library to form an I/O interface. A user interface is provided for receiving a number of parameters provided by the circuit designer. The parameters preferably provide specific information about a circuit design. A set of circuit design assembly rules are also provided, which define the available I/O cells, the available boundary scan logic modules, and the appropriate interconnections for various combinations thereof. A computer program then selects and assembles the I/O cells and boundary scan logic modules in accordance with the user provided parameters and the set of circuit design assembly rules.

In a preferred embodiment, the cells are input, output, and/or bidirectional buffers, and the boundary scan logic modules can be selected to support various test configurations. The present invention then automatically selects and interconnects selected ones of the I/O cells and boundary scan logic modules to form a number of interface modules. The I/O cells and the boundary scan blocks are selected according to the user provided parameters, and are interconnected according to the set of circuit design assembly rules. Further, the present invention may provide an appropriately configured test control block for providing the required test control signals to the interface modules. The resulting interface modules are then expressed as either a number of instantiated components or as a detailed description in a hardware description language.

Finally, the present invention contemplates providing appropriately names terminals on the interface blocks such that the interface blocks can be automatically connected to the I/O pads and core logic within a corresponding ASIC design.

The user provided parameters preferably identify a particular I/O macro cells and a particular boundary scan logic module for each of the I/O pads on the integrated circuit die. This allows the proper selection of components when assembling the interface blocks. In addition, the user provided parameters preferably include a number of fixed parameters including a pin location, a signal use, a pin capacitance, a pin resistance and a scan order. These parameters are labeled as "fixed" parameters because they are primarily dictated by the package design that is selected for the integrated circuit. It is also contemplated that the user provided parameters may also include a number of user specified logic circuit parameters which are related to the particular circuit at hand. Preferably, the user specified logic circuit parameters may include an ASIC terminal name, an input core signal net name, an output core signal net name, an I/O cell name, a boundary scan logic module name, an associated net, an optional spreadsheet sort field, and a test flag.

The user preferably provides the user provided parameters via a spreadsheet interface. The functions commonly provided in spreadsheet programs may be used to automatically generate or manipulate the parameters provided in the spreadsheet. For example, and in a preferred embodiment, the ASIC terminal name is automatically generated by adding a "T" as a suffix to the core signal net name provided in an adjacent column of the spreadsheet. Thus, the spreadsheet interface provides an efficient way to specify, evaluate and document the user specified parameters for a particular circuit design.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
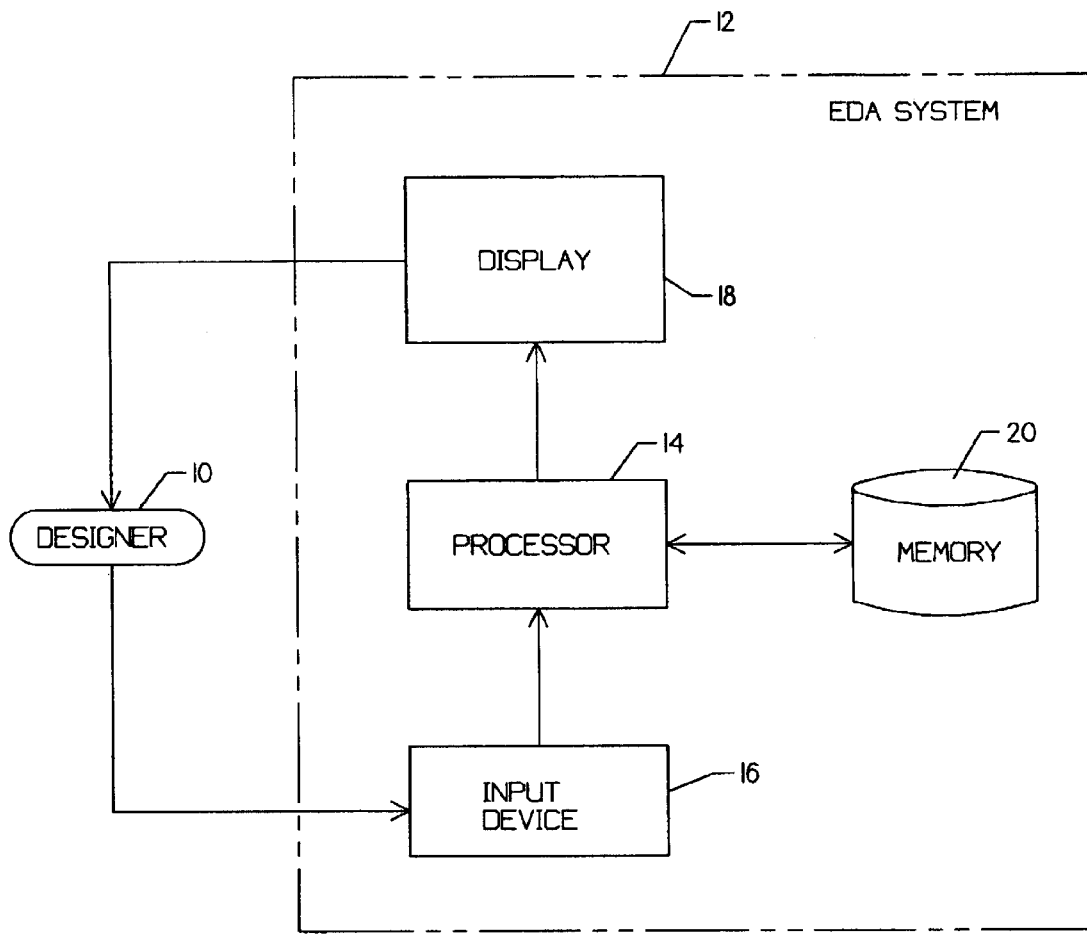
FIG. 1 is a block diagram of the computer-based environment of the present invention.

The detailed descriptions which follow are presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

Furthermore, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases, it should be kept in mind the distinction between the method operations in operating a computer and the method of computation itself. The present invention relates to method steps for operating a computer in processing electrical or other (e.g., mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer, e.g., a source code expression of the present invention is input to the computer to control operations therein. It is contemplated that a number of source code expressions, in one of many computer languages, could be utilized to implement the present invention. A variety of computer systems can be used to practice the present invention, including, for example, a personal computer, an engineering work station, an enterprise server, etc. The present invention, however, is not limited to practice on any one particular computer system, and the selection of a particular computer system can be made for many reasons.

Integrated circuit designers describe the high-level logical representation of a design in terms of equations. This logical representation is called a "behavior" description. The behavior description is simulated and verified to assure that it conforms to the desired specifications. Once the behavior description of the integrated circuit has been verified, it is transformed into a detailed description (also known as a structural or gate-level description). This conversion process is called synthesis. The detailed description represents the equation-based behavior description in the form of gate-level objects (components) and the connections (nets) between the objects. The detailed description is used for the remaining design processes. The detailed description is used to simulate the design at the gate level, establish the initial physical component placement (floor plan), complete the final physical component placement and net interconnect routing (layout), perform delay calculation and timing analysis, and generate test patterns for manufacturing verification. During these remaining design processes, there are various attribute types and attribute values attached to the detailed description. Some of these attributes are generated by the integrated circuit designer (via software tool or tools), while other attributes are generated by the EDA software system. Names of components and nets are one of the main software-generated attributes.

Physical attribute values, especially component placement and interconnect routing coordinates, are contingent upon a name-based design. In other words, each attribute and its value is associated with a given name and the object the name represents. For the physical floor-planning process, a pair of X,Y coordinates (i.e., the physical attribute and given values) are associated with each component in the design. This process is controlled by the designer, but with assistance from the EDA software. For the physical layout process, the X,Y coordinates (again, the physical attribute and given values) are also associated with a specific component and its interconnect (net). This process is usually a manual and automated process implemented by the circuit designer and EDA software. The EDA software may exercise control over the interconnect routing of components or macro cells through a predefined set of circuit design assembly rules.

FIG. 1 is a block diagram of the computer-based environment of the present invention. A Designer 10 interacts with an electronic design automation (EDA) System 12 to enter an integrated circuit design, validate the design, place the design's components on a chip, and route the interconnections among the components. The integrated circuit may be an application specific integrated circuit (ASIC). The EDA System 12 includes a Processor 14, which executes operating system software as well as application programs known as EDA software. The Processor is found in all general purpose computers and almost all special purpose computers. The EDA System 12 is intended to be representative of a category of data processors suitable for supporting EDA operations. In the preferred embodiment, the EDA System is a HP A1097C Series 700 engineering workstation, commercially available from Hewlett-Packard Corporation, although other engineering workstations or computer systems from manufacturers such as Sun Microsystems, Inc. may also be used.

The Designer 10 enters design information into the EDA System by using a well-known Input Device 16 such as a mouse, keyboard, or a combination of the two devices. It should be understood, however, that the Input Device may actually consist of a card reader, magnetic or paper tape reader, or other well-known input device (including another computer system). A mouse or other cursor control device is typically used as an Input Device as a convenient means to input information to the EDA System to select command modes, edit input data, and the like. Visual feedback of the design process is given to the Designer by showing the design being constructed as graphical symbols on Display 18. The Display is used to display messages and symbols to the Designer. Such a Display 18 may take the form of any of several well-known varieties of CRT displays. The EDA software being executed by the Processor 14 stores information relating to logic design in Memory 20. The Memory may take the form of a semiconductor memory, magnetic disks, optical disks, magnetic tape or other mass storage device.

Figure 2:
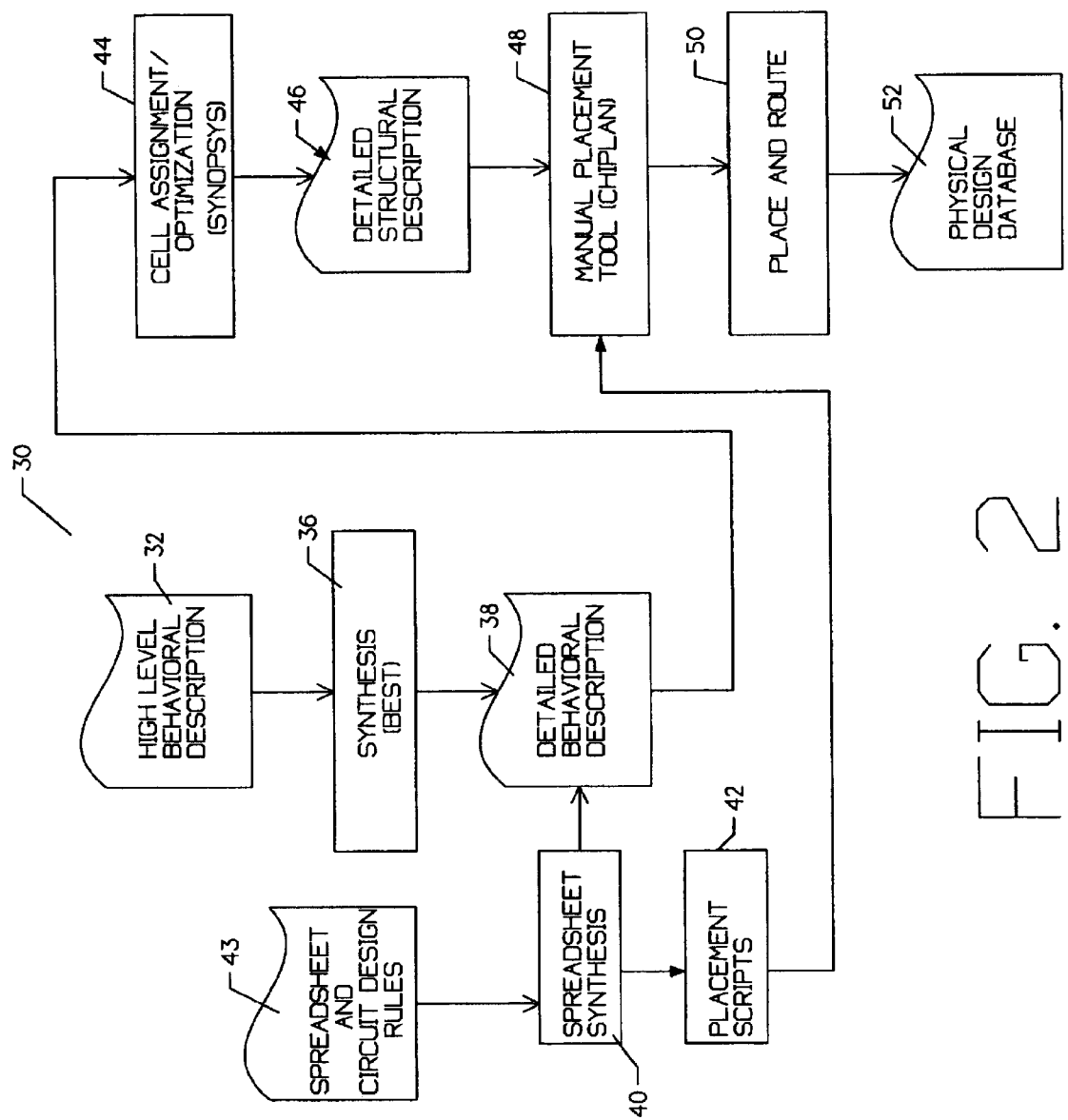
FIG. 2 is a flow diagram showing an illustrative design process for a circuit design incorporating a first embodiment of the present invention.

FIG. 2 is a flow diagram showing an illustrative design process for a circuit design incorporating a first embodiment of the present invention. The diagram is generally shown at 30 wherein a high level behavioral description 32 is provided. The high level behavioral description 32 is provided to a logic synthesis tool 36, which generates a detailed behavioral description 38 of the circuit design. A preferred synthesis tool is the BEST tool developed by the Unisys Corporation.

In accordance with the present invention, spreadsheet synthesis 40 is a software program which is executed on an engineering workstation and automatically implements a large portion of the interface logic to the circuit design. A spreadsheet having a number of user defined parameters (see also, FIG. 5), and a set of circuit design assembly rules are provided to the spreadsheet synthesis tool 40, as shown. In the preferred embodiment, the spreadsheet is generated using a spreadsheet program, such as EXCEL™, which is available from the Microsoft Corporation. As indicated above, the user defined parameters define the selection and interconnection of selected I/O cells and boundary scan logic modules for the overall circuit design. The set of circuit design assembly rules define the criteria to automatically generate and interconnect the boundary scan logic, including appropriate test signals. Spreadsheet synthesis 40 then assembles a number of interface modules in accordance with the user provided parameters and the circuit design assembly rules.

In one embodiment, spreadsheet synthesis 40 adds the interface modules to the detailed behavioral description 38 of the circuit design. Further, spreadsheet synthesis 40 may provide placement scripts 42, which specify the physical attribute values for placement and interconnect routing of the interconnect modules. The placement scripts 42 are provided to a manual placement tool 48, as shown.

The detailed behavioral description 38 is then provided to a cell assignment/optimization tool 44, which assigns library components to the detailed description and optimizes the logic therein. A preferred cell assignment/optimization tool is available from Synopsys, Inc. The cell assignment/optimization tool provides a detailed structural description 46, which is then provided to manual placement tool 48. A preferred manual placement tool is the Chiplan tool developed by the Unisys Corporation.

The manual placement tool 48 provides at least a partially placed circuit design to an automatic place and route tool 50. The placement scripts 42 may facilitate the manual placement of the interface sections of the circuit design. The automatic place and route tool 50 automatically places the remaining cells within the design, and routes the nets to interconnect the cells. The automatic place and route tool provides a physical design database, as shown at 52.

Figure 3:
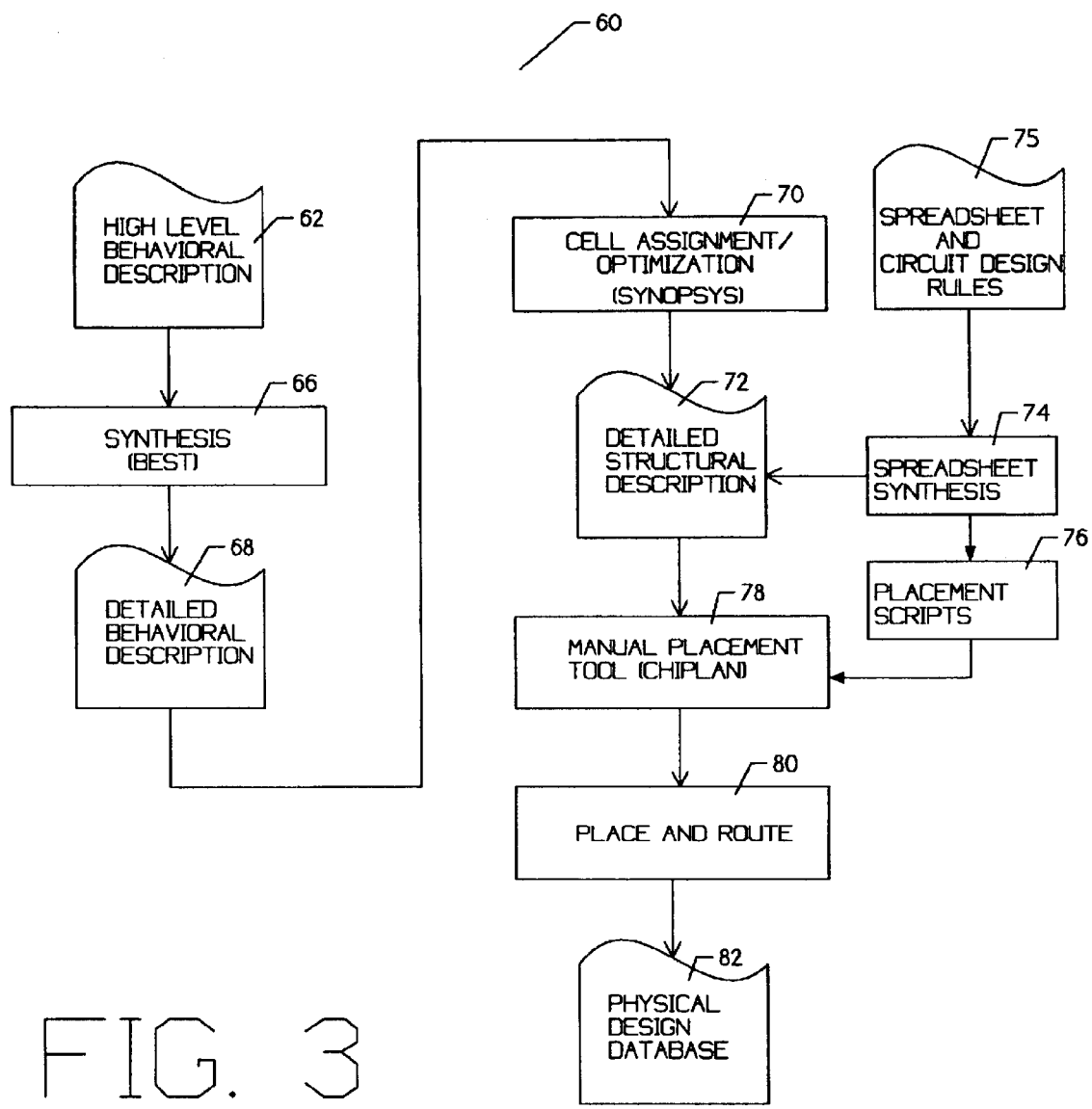
FIG. 3 is a flow diagram showing an illustrative design process for a circuit design incorporating an alternative embodiment of the present invention.

FIG. 3 is a flow diagram showing an illustrative design process for a circuit design incorporating an alternative embodiment of the present invention. The diagram is generally shown at 60. The high level behavioral description 62 is provided to logic synthesis tool 66. Logic synthesis tool 66, which is preferably the BEST tool available from the Unisys Corporation, generates the detailed behavioral description 68 of the circuit design. The detailed behavioral description 68 is then provided to a cell assignment/optimization tool 70, which assigns library components to the detailed description and optimizes the logic therein. The cell assignment/optimization tool, which is available from Synopsys, Inc., provides a detailed structural description 72.

In this embodiment, spreadsheet synthesis 74 automatically generates a detailed structural description of the input, output, and bidirectional buffers and automatically generates all boundary scan logic for the circuit design. Spreadsheet synthesis 74 instantiates the appropriate cells within the detailed structural description 72. Spreadsheet synthesis 74 also provides placement scripts 76, which specify the physical attribute values for placement and interconnect routing of the input, output, and bi-directional buffers and selected boundary scan logic to manual placement tool 78.

The resulting structural or gate level description is provided to manual placement tool 78. The manual placement tool 78 provides at least a partially placed circuit design to an automatic place and route tool 80. The placement'scripts 76 may facilitate the manual placement of the cells instantiated by spreadsheet synthesis 74. Automatic place and route tool 80 automatically places the remaining cells within the design, and routes the nets to interconnect the cells. The automatic place and route tool provides a physical design database, as shown at 82.

Figure 4:
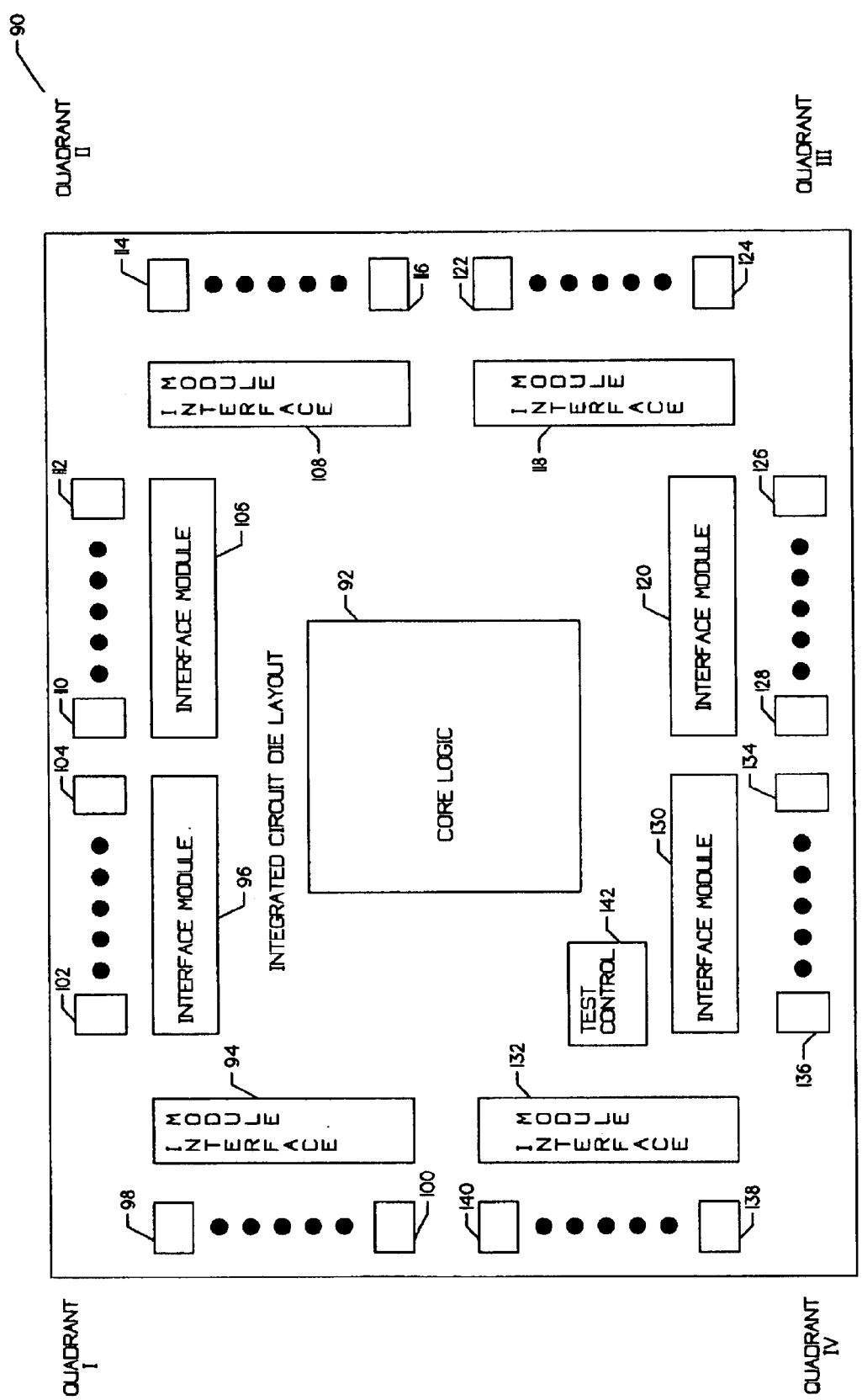
FIG. 4 is a block diagram showing an illustrative layout of the location of the interface modules on an integrated circuit die.

FIG. 4 is a block diagram showing an illustrative layout of the location of the interface modules on an integrated circuit die. The integrated circuit die layout is shown generally at 90 and represents the physical design database as shown at 52 in FIG. 2. Integrated circuit die layout 90, for purposes of illustration, is shown as being sectioned into four quadrants which are quadrant 1, quadrant 2, quadrant 3 and quadrant 4. Integrated circuit die layout 90 has core logic 92, wherein each quarter of core logic 92 is positioned within one of the four quadrants.

Interface module 94 and interface module 96 show the placement of the input, output, and bi-directional buffers and all scan logic for all bonding pad locations within quadrant 1. Interface module 94 couples to a number of bonding pads positioned between bonding pad 98 and bonding pad 100. Interface module 96 couples to a number of bonding pads positioned between bonding pad 102 and bonding pad 104. Terminals on the interface modules that connect to test control 142 are generated by spreadsheet synthesis 40 along with interface modules 94, 96, 106, 108, 118, 120, 130 and 132.

Figure 5:
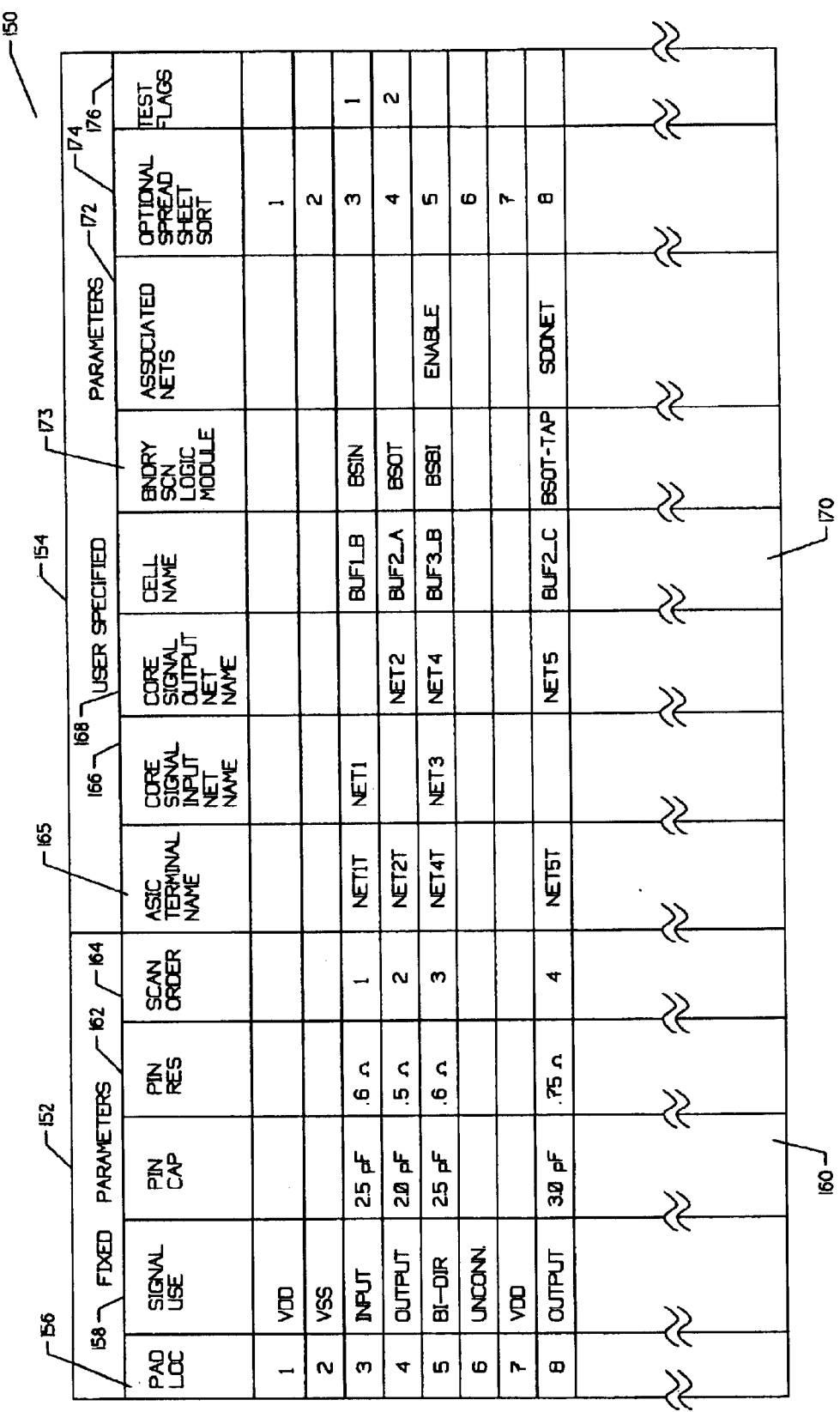
FIG. 5 is a table showing an illustrative spreadsheet which provides the user input to the preferred embodiment of the present invention.

FIG. 5 is a table showing an illustrative spreadsheet which provides the user interface to the preferred embodiment of the present invention. Spreadsheet 150 provides a user interface to spreadsheet synthesis 40, which implements a large portion of the interface logic to the circuit design. Spreadsheet 150 is divided into input fields under fixed parameters 152 and user specified logic circuit parameters 154.

Fixed parameters 152 relate to fixed parameters or attributes of integrated circuit die layout 90 resulting from the fixed physical location of the bonding pads within integrated circuit die layout 90. These parameters are labeled as "fixed" parameters because they are primarily dictated by the package design that is selected for the integrated circuit. Spreadsheet 150 has a row of information relating to each bond pad location within integrated circuit die layout 90. Pad location 156 designates each pad within integrated circuit die layout 90, which is coupled to a power (VDD), a ground (VSS), or a functional signal. Spreadsheet 150 shows pad locations 1–8 for illustrative purposes, but it is understood that many more pads are available on a typical integrated circuit die layout.

Signal use 158 indicates the signal use for a particular pad location 156. Signal use 158 includes VDD, VSS, and signals which are input, output and bidirectional, as well as unconnected bonding pads.

Fixed parameters, 152 also includes pin capacitance 160 and pin resistance 162. These represent physical characteristics resulting from the proximity of a particular bonding pad location to the respective input, output or bi-directional buffer. This information aids the designer 10 in selecting which bonding pad under pad location 156 should be used for particular signals such as critical timing path signals. For example, the designer 10 may select a particular bonding pad under pad location 156 for input or output signals requiring optimal performance where pin capacitance 160 and pin resistance 162 are minimized. Pin capacitance 160 and pin resistance 162 give the designer 10, in effect, a goodness rating of a particular bonding pad under pad location 156 to aid in selection of a particular buffer type. For example, bonding pad location 4 under pad location 156 has a lowest pin capacitance 160 (2.0 pF) and pin resistance 162 (0.5 ohms) in comparison to bonding pads 3, 5 and 8 under pad location 156. Bonding pad locations 1, 2, and 7 are unavailable, as they are dedicated to VDD or VSS. In this illustrative example, bonding pad location 6 under pad location 156 is unconnected.

Fixed parameters 152 further has a field for scan order, which is shown at 164. Scan order 164 indicates the order in which the boundary scan logic modules for each pad are coupled together. Scan order 164 is based upon the physical location of the bonding pads under pad location 156 on integrated circuit die layout 90, and links all functional inputs together while skipping bonding pad locations under pad location 156 which correspond to VDD, VSS or unconnected pads.

Spreadsheet 150 also has a number of fields under user specified parameters 154. The designer 10 matches a core signal net name originating from core logic 92 to a particular input, output or bidirectional buffer, thus coupling the buffer to one of the bonding pad locations under pad location 156. The input core signal net names are entered at 166 if the corresponding signal is to be driven into the integrated circuit. The output core signal net names are entered at 168 if the signal is an output from core the core logic section, and is driven off-chip. Bi-directional buffers, which drive signals both on and off the integrated circuit, have a core signal net name entered in both the core signal input net name column 166 and the core signal output net name column 168.

In an example, bonding pad 3 under pad location 156 is an input under signal use 158 and has the illustrative core signal net name of "net1l" under core signal input net name 166. Similarly, bonding pad location 4 under pad location 156 is an output under signal use 158 and has the illustrative core signal net name "net2" under core signal output net name 168. Also, bonding pad location 5 under pad location 156 is a bidirectional buffer under signal use 158 and has the illustrative core signal net names "net3" under core signal input net name 166 and "net4" under core signal output net name 168.

User specified parameters section 154 further has a cell name field 170 which allows a designer 10 to choose an input, output or bi-directional cell based on edge speed and drive strength requirements of the net as indicated within the field under pin capacitance 160 and pin resistance 162. For example, each input, output or bidirectional buffer may correspond to a cell name under cell name 170, indicating both a buffer type and a drive strength. Thus, for example, bonding pad location 3 under pad location 156, in this illustrative example, has BUF1_B under cell name 170, where BUF1 indicates the buffer is an input buffer and _B indicates a medium drive strength. According to this convention, _A indicates a low drive strength, _B indicates a medium drive strength, and _C indicates a high drive strength. It is desirable to match the impedance of the input, output and bi-directional buffers under cell name 170 to optimize performance of the integrated circuit die layout 90.

Continuing with the example, Signal use 158 indicates an output buffer for bonding pad location 4 and pin capacitance 160 and pin resistance 162 indicate lower capacitance and resistance than for bond pad locations 3, 5 and 8 under pad location 156. Thus, bonding pad location 4 references the cell name BUF2__A, indicating the buffer is an output buffer having a low drive strength.

The buffers coupled to bonding pads 3 and 5 under pad location 156 have medium drive strengths due to the pin capacitance 160 and pin resistance 162 of 2.5 pF and 0.6 ohms respectively being mid-range in the range of capacitance and resistance values for bonding pad locations 3, 5 and 8. For bonding pad location 5, the cell name BUF3 indicates a bi-directional buffer, and __B indicates medium drive strength.

Bonding pad location 8 under pad location 156 has the highest capacitance and resistance under pin capacitance 166 and pin resistance 162 which for illustrative purposes is 3.0 pF and 0.75 ohms, respectively. Thus, for bonding pad location 8, the cell name BUF2 indicates an output buffer (same as bonding pad location 4), and __C indicates high drive strength.

User specified parameters section 154 also has a boundary scan logic module column 173. Like the cell name column, the boundary scan logic module column 173 allows the user to select the boundary scan module that is associated with the corresponding I/O cell. For example, at pad location 3, a BSIN module is selected. The BSIN module is used to provide the desired test function to the BUF1__B buffer cell that is at that location. This enables the user to specify which boundary scan modules are provided at each pad location. It contemplated that each of the boundary scan logic modules may support the Test Access Port (TAP) requirements, the Level Sensitive Scan Design (LSSD) requirements, or preferably.

User specified parameters section 154 further has one or more columns for associated nets 172, which indicate the net name of any associated nets coupled to I/O cells or boundary scan logic modules for a particular bonding pad location under pad location 156. For example, BUF3__B under cell name 170 for bonding pad 5 under pad location 156, is coupled to the net "enable" indicated under associated nets 172. In this example, the enable signal is used to control when the bi-directional buffer BUF3__B is configured as an input and as an output.

User specified parameters 154 further has optional spreadsheet sort column 174. By using a sort function of a spreadsheet tool, a user may soft the rows of the spreadsheet according to the numbers specified in the optional spreadsheet sort column 174. By specifying the appropriate numbers in the optional spreadsheet sort column 174, the rows of the spreadsheet may be sorted in virtually any desired way.

User specified parameters section 154 further has a test flag 176 to allow the designer 10 to indicate which bonding pads under pad location 156 will be tested. In the preferred embodiment, if integrated circuit die layout 90 contain more than 400 pins, less than 100 pins would likely be tested by an external object or memory tester. The untested bond pad locations would be tested through the boundary scan logic modules. In this illustrative spreadsheet 150, bonding pads 3 and 4 under pad location 156 may control or test data pins used with an external tester, wherein bonding pads 5 and 8 under pad location 156 may be tested through the boundary scan logic modules. These special pins preferably also have special logic instantiated by the proper selection of the corresponding boundary scan logic module.

Finally, the user specified parameter section 154 may include an ASIC terminal name field 165. The ASIC terminal name field 165 provides terminal names to the interface logic which match the terminal names of the pads. For example, and in a preferred embodiment, the ASIC terminal name is the same as the corresponding core signal name, with a "T" added as a suffix. When more than one core signal name is given for a particular pad, for example when a bi-directional buffer is used, a preferred convention is to use the core signal output name. Thus, for pad location 5, the ASIC terminal name is NET4T, which corresponds to the core signal output net name. In a preferred embodiment, the functions in the EXCEL™ spreadsheet program available from the Microsoft Corporation are used to automatically generate the ASIC terminal names.

Once spreadsheet 150 is complete, the interface between the core logic nets of core logic 92 (see FIG. 4) and the bonding pads on integrated circuit die layout 90 are defined and spreadsheet synthesis 40 (see FIGS. 2–3) may be executed to automatically generate a detailed structural description of the interface modules, as well as the physical attribute values for placement and interconnect routing of the interface modules.

It is understood, although not explicitly shown, that if any test or functional signal share the same pin, a multiplexer cell is automatically added and a corresponding multiplexer select net is coupled to the appropriate signal to allow the bonding pad to be switched between the functional and test modes. This multiplexer function is preferably provided by the corresponding boundary scan logic module.

Figure 6:
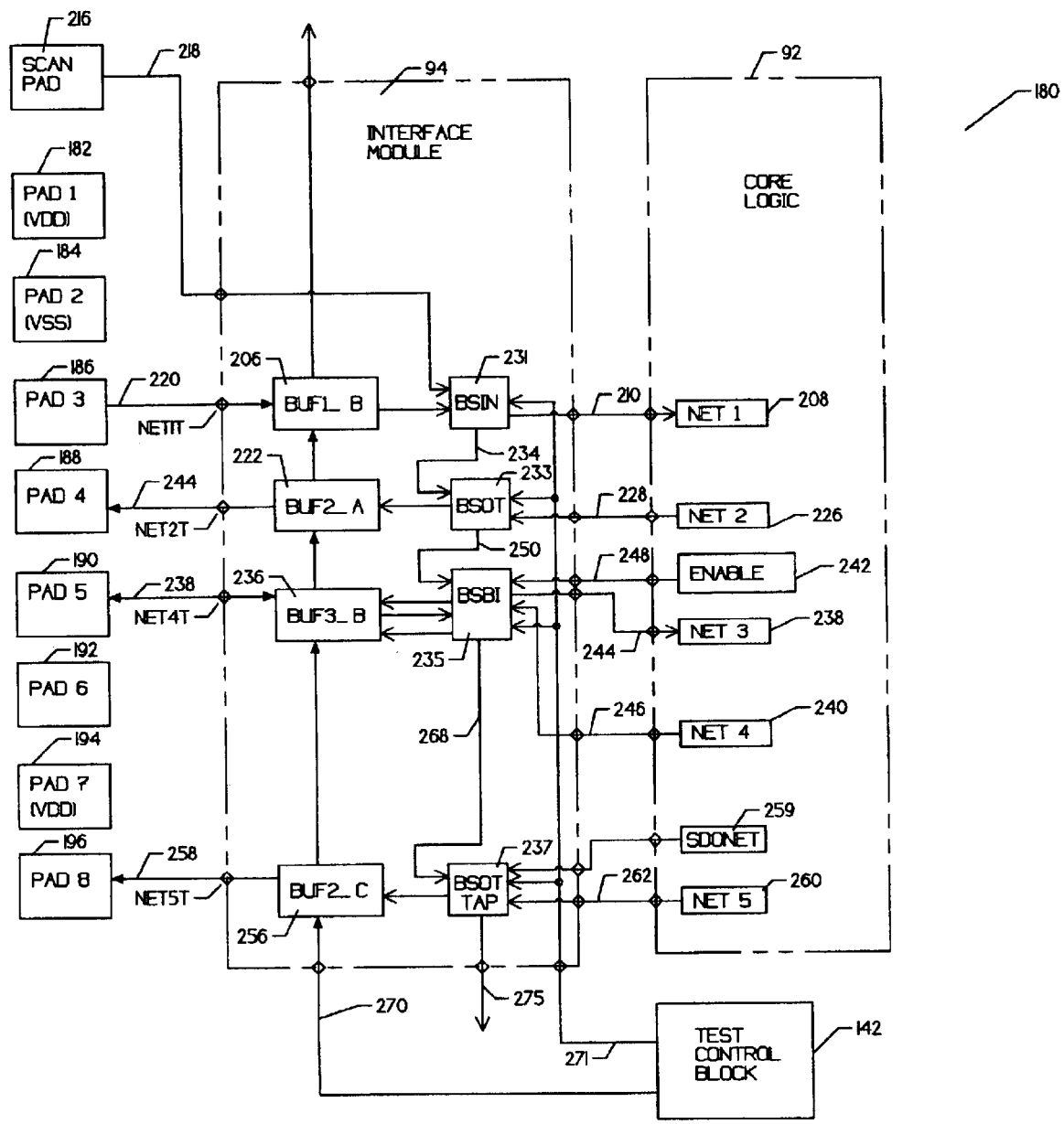
FIG. 6 is a block diagram showing the result of executing the user input of FIG. 5 in the preferred embodiment of the, present invention.

FIG. 6 is a block diagram showing the result of executing the user input of FIG. 5 in the preferred embodiment of the present invention. The block diagram is shown generally at 180 and includes core logic 92 and interface module 94 (see also, FIG. 4). Block diagram 180 is the physical design database 182 resulting from spreadsheet synthesis 40 using the user defined parameters of FIG. 5. Pad 1 182, pad 2 184, pad 3 186, pad 4 188, pad 5 190, pad 6 192, pad 7 194 and pad 8 196 correspond to bonding pads 1–8, respectively, under pad location 156 of FIG. 5.

In FIG. 5, bonding pad 1 and 7 under pad location 156 have a signal use of VDD, and bonding pad 2 under pad location 156 has a signal use of VSS. These power pins are connected to a power grid, which is typically designed for the entire integrated circuit die.

Bonding pad 3 under pad location 156 is specified as an input under signal use 158, as first in the scan chain order under scan order 164, as coupled to net1 under core signal input net name 166, as having an I/O cell BUF1__B, and as having a boundary scan logic module BSIN. In accordance therewith, the spreadsheet synthesis tool selects and provides the components BUF1__B 206 and BSIN 231 within interface module 94, as shown. Further, the spreadsheet synthesis tool connects the input of BUF1__B 206 to a terminal named NET1T (the ASIC terminal name), which is then automatically connected to bonding pad 3 by name association. The output of BUF1__B 206 is provided to BSIN 231 as shown. BSIN provides the desired test function to the path corresponding to pad 3. Since pad 3 is specified as being first in the scan chain, the spreadsheet synthesis tool connects BSIN 231 to a scan pad 216, as shown.

Bonding pad 4 under pad location 156 is specified as an output under signal use 158, as second in the scan chain order under scan order 164, as coupled to net2 under core signal output net name 168, as having, an I/O cell BUF2__A, and as having a boundary scan logic module BSOT. In accordance therewith, the spreadsheet synthesis tool selects and provides the components BUF2__A 222 and BSOT 233 within interface module 94, as shown. Further, the spreadsheet synthesis tool connects the input of BUF2_A 222 to a terminal named NET2T (the ASIC terminal name), which is then automatically connected to bonding pad 4 by name association. The input of BUF2_A 222 is coupled to BSOT 233 as shown. BSOT 233 provides the desired test function to the path corresponding to pad 4. Since pad 4 is specified as being second in the scan chain, the spreadsheet synthesis tool connects the scan data input of BSOT to a the scan data output of BSIN 231.

Bonding pad 5 under pad location 156 is specified as a bi-directional buffer under signal use 158, as third in the scan chain order under scan order 164, as coupled to net3 under core signal input net name 166, as coupled to net4 under core signal output net name 168, as having an I/O cell BUF3_B, and as having a boundary scan logic module BSBI. Pad 5 is also shown as having an associated net 172 called enable, which in this case, controls the direction of the bi-directional buffer. In accordance therewith, the spreadsheet synthesis tool selects and provides the components BUF3_B 236 and BSBI 235 within interface module 94, as shown. Further, the spreadsheet synthesis tool connects the input of BUF3_B 236 to a terminal named NET4T (the ASIC terminal name), which is then automatically connected to bonding pad 5 by name association. BUF3_B 236 is coupled to BSBI 235 via three separate interfaces. These interfaces are for transferring an input signal, an output signal and an enable signal therebetween, as shown, BSBI 235 provides the desired test function to the path corresponding to pad 5. Since pad 5 is specified as being third in the scan chain, the spreadsheet synthesis tool connects the scan data input of BSBI to a the scan data output of BSOT 233.

Bonding pad 6 under pad location 156 is specified as being unconnected under signal use 158, and thus, pad 6 192 remains unconnected.

Bonding pad 8 under pad location 156 is specified as an output under signal use 158, as fourth in the scan chain order under scan order 164, as coupled to net5 under core signal output net name 168, as having an I/O cell BUF2_C, and as having a boundary scan logic module BSOT-TAP. In accordance therewith, the spreadsheet synthesis tool selects and provides the components BUF2_C 256 and BSOT-TAP 237 within interface module 94, as shown. Further, the spreadsheet synthesis tool connects the input of BUF2_C 256 to a terminal named NET5T (the ASIC terminal name), which is then automatically connected to bonding pad 8 by name association. The input of BUF2_C 256 is coupled to BSOT-TAP 237 as shown. BSOT-TAP 237 provides the desired test function to the path corresponding to pad 8. Since pad 8 is specified as being fourth in the scan chain, the spreadsheet synthesis tool connects the scan data input of BSOT-TAP 237 to a the scan data output of BSBI 235. The scan data output of BSOT-TAP 237 is provided as an output 275 of interface module 94 so that the scan chain may be continued in another interface module, if desired.

In addition, it is contemplated that pad 8 may be shared by a scan data out signal (SDONET) and a functional signal (NET5), depending on the selected mode of the device. In the illustrative embodiment, BSOT-TAP 237 may provide a multiplexer cell (not shown) which allows the signal on the SDONET 259 to be provided to pad 8 when in test mode, and the signal on NET5 to be provided to pad 8 when in functional mode. A control signal may be provided to the multiplexer cell in BSOT-TAP 237 by test control block 142. This may allow pad 8 to be shared by two separate signals, as described above.

The interconnection of the various combinations of I/O cells and boundary scan logic modules is defined by the set of circuit design assembly rules. Further, the required test control signals that are needed to support the selected boundary scan logic modules is also provided by the circuit design assembly rules. The test control signals are shown at 270 and 271, and are provided as terminals on interface module 94. A test control block 142 may be provided, and the control signals required by interface module 94 are automatically connected to the proper control signals provided by test control block 142 by name association.

Figure 7:
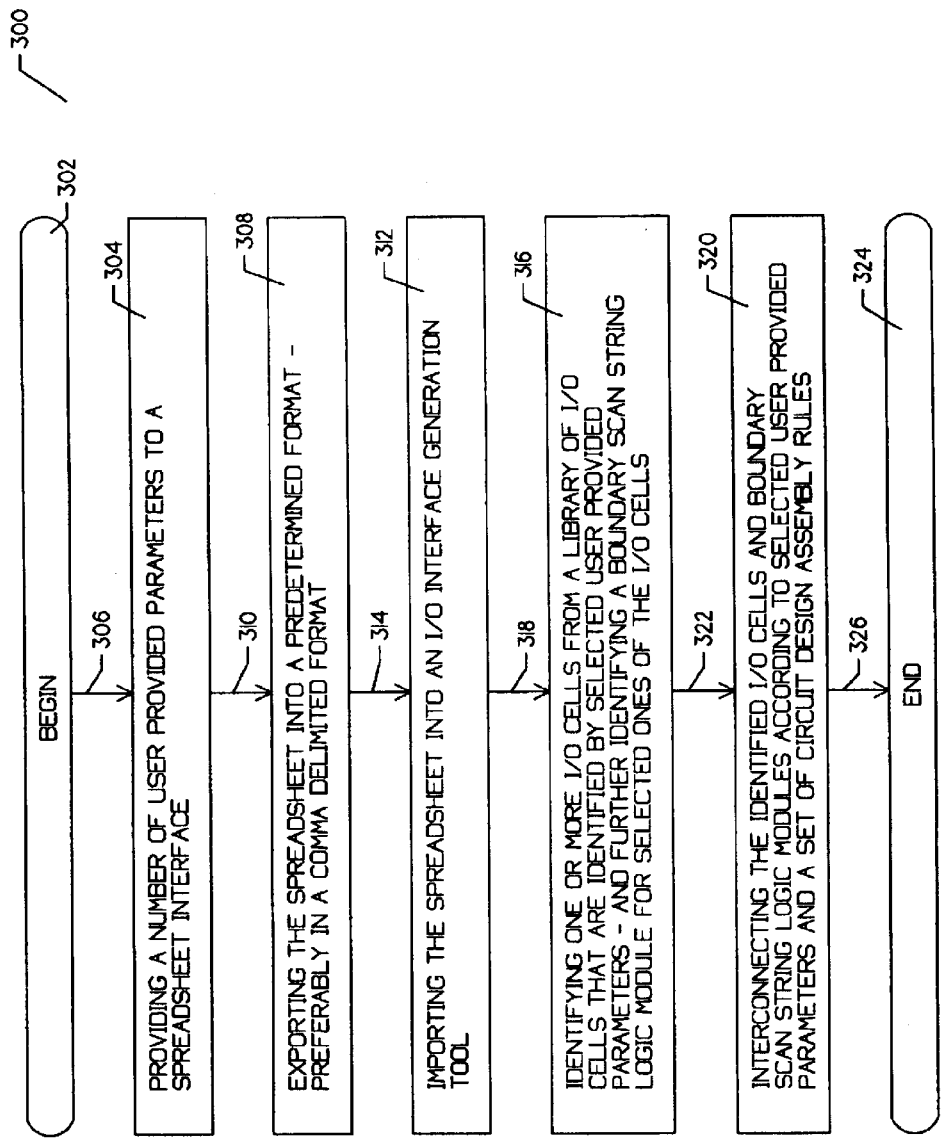
FIG. 7 is a flow diagram showing a preferred method of the present invention.

FIG. 7 is a flow diagram showing a preferred method of the present invention. The diagram is shown generally at 300, and is entered at element 302. Control is passed to element 304 via path 306. Element 304 provides a number of user provided parameters to a spreadsheet interface. Control is then passed to element 308 via path 310. Element 308 exports the spreadsheet into a predetermined format, and preferably into a comma delimited format. Control is then passed to element 312 via path 314. Element 312 imports the spreadsheet into an I/O interface generation tool. The I/O interface generation tool is the spreadsheet synthesis tool referred to above. Control is then passed to element 316 via path 318. Element 316 identifies one or more I/O cells from a library of I/O cells and one or more boundary scan logic modules. This identification is made with reference to selected user provided parameters. Control is then passed to element 320 via path 322. Element 320 interconnects the identified I/O cells and boundary scan logic modules according to selected user provided parameters and a set of circuit design assembly rules. Control is then passed to element 324 via path 326, wherein the algorithm is exited.

Below is the preferred source code for the spreadsheet synthesis tool described above.

```
/* Program: bufgen
 Author: K Merryman
 Description: Bufgen takes in a spreadsheet format file
 containing i/o information about an asic module and
 generates the buffer midmacros in BDL.
*/
#/include <stdio.h>
#include <string.h>
#include <stdlib.h>
#include <stdio.h>
#include <time.h>
#include <ctype.h>
#include "avl.h"
```

-continued

```
#define RULE_FILE "q:\\itasca\\tools\\bufgen.rul"
/* Debug Rules Directory */
/* #define RULE_FILE "c:\\bufgen\\bufgen.rul" */
typedef struct rule {   /* rule or general string linked list */
        char *connect_str;
        struct rule *next;
} RULE;
typedef struct chain{   /* chain number or general int linked list */
        int chain_no;
        struct chain *next;
} CHAIN;
typedef struct{     /* buffer macro description */
        char *bufname;      /* buffer name or type */
        char *compname;        /* buffer instantiated name string */
        RULE *conn_start; /* pointer to linked list of connection rules */
        CHAIN *chain_start; /* pntr to linkd list of chains updated by buffer */
} BUFFER;
typedef struct bufll {    /* Linked list of buffer macros */
        BUFFER *buf;
        struct bufll *next;
} BUFLL;
BUFFER *bflist[71];    /* Total list of buffer types from rules */
typedef struct bufmm { /* Linked List of buffer mid macros */
        char *bufmmname; /* Buffer mid macro name */
    char bidi_bool;     /* boolean of whether the bufmm contains bidis */
        RULE *in_term;       /* linked list of input terminals */
        RULE *out_term;      /* linked list of output terminals */
        RULE *bidi_term;     /* linked list of bidi terminals */
        RULE *net;        /* linked list of nets */
        RULE *connect;        /* linked list of connections */
        int chain_begin[10]; /* line no for start of chain number */
    int chain_end[10]; /* line no for end of chain number */
        struct bufmm *next; /* link to next bufmm */
} BUFMM;
BUFMM *bufmm_start; /* Pointer to start of buffer midmacro link list */
BUFMM *bmm_lastptr = NULL; /* Pointer to the last buffer midmacro in ll */
char *rule_rev;
char asic_name[10] = " "; /* Buffer midmacro prefix name */
int tot_macros; /* Total number of buffer types defined in rules */
int tot_bufmm; /* Total number of buffer midmacors defined */
int name_no;
char bidis_bool = 'F'; /* Bidi present boolean charater T or F */
int chain_num = 0; /* Global parameter non-zero indicates that a string
                              generated includes a chain variable for chain_num. */
int chain_if_num = 0; /* Chain i/f being generated if nonzero */
char chain_dir = 'O'; /* Global chain direction variable (can also be
                              C for connection */
int header_lns = 5; /* The number of ss header lines */
int sslns = 1;          /* Spreadsheet lines (excluding header lines */
int line_adj = 0;           /* Adjusts spreadsheet line from array to ss */
int screen_lns = 0;         /* The number of lines output to the screen before brk */
char msg[300];             /* Input line from the spreadsheet */
char brk[20];             /* break string for debug */
char bidi_attribute[50]
= " "; /* bidi bdl
attribute */
        int scan_ord_cl = 0; /* Scan string order column. if 0 scan is in
                              order of input*/
        int term_cl = 1;    /* termial spreadsheet column */
        int input_cl = 1;           /* Input termial spreadsheet column */
    int output_cl = 1; /* Output terminal spreadsheet column */
        int bit_cl = 2;      /* vector bit spreadsheet column */
        int direct_cl = 3;       /* terminal direction spreadsheet column */
        int pin_cl = 8;          /* pin spreadsheet column */
        int pad_cl = 4;          /* pad spreadsheet column */
        int bump_cl = 4;         /* bump spreadsheet column */
    int flags_cl = 10;  /* LSSD flags column */
        int bufmm_cl = 6;       /* buffer midmacro column */
        int process_cl = -1;        /* process this row flag ie process this row if
                              this column is not blank.
If not specified all
                              rows are process */
        int bufvar_cl[10]; /* buffer variable columns */
        int ssvar_cl[12];   /* spreadsheet variable columns range 1..10 */
        char *scan_chain_var[10]; /* Scan chain variable pointer list */
        RULE *scan_end_name[10]; /* Scan chain naming convention for chain ios*/
        int ssvars = -1;      /* total spreadsheet variable indices */
    int chainvars = 5; /* total scan chain variables */
    int bufvars = -1;
```

-continued

```
        AVLTREE *ins = NULL;
        AVLTREE *outs = NULL;
/* This struct is one entry per termial or spreasheet line */
typedef struct{
        char *tname;        /* Asic terminal name */
    char *input;            /*   input terminal name */
        char *output;           /*   output terminal name */
    char *bit_no;       /* vector bit no */
        char direction;     /* in out direction */
        char *pad;          /* pad name */
        char *pin;          /* pin name */
        char *bump;                             /* bump name */
    char *flags;            /* LSSD flags */
        BUFLL *buf_start;   /* ptr to start of list of buffers to instantiate */
        RULE *ssvar_start;  /* linked list of spreadsheet variables */
        int nextbit;    /* index to next bit of vector for constructing BDL if */
        char chkd;          /* checked flag for consistency with name correction */
        char hdrf;          /* header flag first bit of the vector */
        char *bfmm; /* buffer mid macro name for pin */
    int ssln_no;   /* Actual Spreadsheet line number for error reporting */
} ROW;
void load_struc(int flds_rd,char *ltoks[ ],ROW *sprdsht[ ],int param_line,
        char* filename, int header_lns);
BUFFER *get_bufr_ptr(char *bname);
BUFMM *get_bufmm_ptr(char *bname);
FILE *open_file(char *filename);
FILE *out_file(char *filename);
int csvparse(char *s, char *tkn[ ]);
int output_pinscr(ROW *iflist[ ],int pins,FILE *fptr);
char *trmstr(char *t_string);
char *Strdup(char *s);
void prog_header(char *prog_header,char *prog_rev,char *update);
int order_bits(ROW *iflist[ ],int terms);
char *tstrupper(char *s);
char *strupper(char *s);
char *tstrsufx(char *s, char suffix);
char *tstripver(char *s);
char *Strtreedup(char *s);
void *Calloc(size_t n,size_t s);
int StringCompare(const void *p1,const void *p2);
char *make_name( int lnn, char *name, ROW *sprdsht[ ],FILE *fbptr,BUFMM *bufmmptr);
char *tree_names( int lnn, char *name, ROW *sprdsht[ ]);
char rsvd_wd(char *name);
int wr_out_bdl(ROW *iflist[ ], char *bfname,
        FILE *fbptr, char *prog_rev, int slines);
void wr_out_addl(ROW *iflist[ ], char *bfname, FILE *fbptr, int slines);
void fix_suffix(ROW *sprdsht[ ],int slines);
void load_rules(FILE *fptr);
void bdl_terminals(ROW *iflist[ ], char *bfname, FILE *fbptr,
int slines, char term_dir);
void bdl_comps(ROW *iflist[ ], char *bfname, FILE *fbptr, int slines);
void bdl_connections(ROW *iflist[ ], char *bfname, FILE *fbptr, int slines);
void bdl_conn_terms(ROW *iflist[ ]; char *bfname, int slines);
void do_conn_rules(RULE *rptr, FILE *fbptr, int ssrow,ROW *iflist[ ],BUFMM *bfrmm);
void include_list(RULE *rptr, FILE *fbptr);
char *parse_param(char *instr);
int fn_chk(char *instr);
char *form_bit(int i,char *bfname,ROW *iflist[ ]);
void *update_chain( int lnn, BUFLL *buflist, ROW *sprdsht[ ]);
void find_chain_ends(ROW *iflist[ ], int slines);
void init_chain_vars(BUFMM *bfrmm, ROW *iflist[ ]);
void chain_if(BUFMM *bfrmm, ROW *iflist[ ], FILE *fbptr,char *t_attr,
                char dir);
void make_chain_term(char *conn_ln, int row, FILE *fbptr,
            char *t_attr, char conn);
int check_spreadsheet(ROW *iflist[ ], int slines);
 main(argc,argv)
 int argc;
 char *argv[ ];
{
        int i = 0;
    int k = 0;
        int flds_rd = 0;
        int line = 0;
        int status = 0;
        FILE *fptr;
        FILE *foptr;
        FILE *fbptr;
        FILE *faptr;
```

-continued

```
            FILE *rfptr;
            char filename[52] = "c:\\bufgen\\p1.csv";
            char ofilename[52] = "c:\\bufgen\\p1.sup";
            char bpathname[52] = " ";
            char bfilename[52] = " "; ,
            char rfilename[52] = RULE_FILE;
            char prog_name[10] = "BUFGEN";
            char prog_rev[7] = "1R4T";
            char update[10] = "08/12/94";
            char bdlext[5] = ".bdl";
    char addlext[5] = ".add";
    char *hputext = "aput";
    char *underscr = "_";
    char *bkslash = "\\";
            char *ltoks[30];
            char *tkn;
            char *s;
            static ROW *sprdsht[1021];
            char *header[6]; /* Header pointer array for rev control use */
            BUFMM *bmm = NULL;
            char* common_bmm = "COMMON";
            char process_all = 'F';
    char gen_add_log = 'T';
            prog_header(prog_name,prog_rev,update);
            if (argc > 1){
                strcpy(rfilename,argv[1]);
            }
            if(argc > 2){
printf("*************************************************************\n");
            printf("***Error** Extra Input parameter on Execution Line of Program\n");
            printf("*************************************************************\n");
            }
            printf("Using Rules file= %s; \n",rfilename);
            rfptr = fopen(rfilename,"r");
            load_rules(rfptr);          /* read rules file in bufgen.rul */
            fclose(rfptr);
            name_no = 1;                        /* Initialize name generation number */
            if(process_cl<0){  /* if no process row column set process all rows */
                process_cl = 1;
                process_all = 'T';
            }
            for(i=0;i<=1020;i++){ /* Initialze sprdsht array pointers to NULL */
             sprdsht[i] = NULL;
            }
    i=0;
            printf("Enter Asic Name Prefix for the Buffer Midmacros or Return\n");
            gets(asic_name);   /* get and format asic name */
            strupper(trmstr(asic_name));
            if (strlen(asic_name) > 0){
                strcat(asic_name,underscr);
            }
            fptr = open_file(filename);   /* open the file for reading */
            line = 0;
reget:
            while (fgets(msg, 299, fptr) != NULL) {   /* read a string from the file */
/*          printf("msg1 = %s", msg);              /* debug display
*/
            if (!strchr(msg,'\n')){
                printf("** Error * The following input string length too long.\n");
                printf("%s",msg);
    goto reget;
            };
/*          printf("tok1 = %s\n",ltoks[1]); /* debug */
/*          printf("bdl extension = %s", bdlext);
    gets(brk); */
                if (line >= header_lns){
                 if (line >1020){
                    printf("** Fatal Error ** Array overflow too many spreadsheet lines. Limit =
620\n");
                    exit(9);
    }
                if (strlen(trmstr(msg))>1){
                ltoks[scan_ord_cl] = NULL;
                    flds_rd = csvparse(msg,ltoks); /* parse it and return the number of
            tokens or pointers to the tokens */
                if (process_all == 'T' || strlen(ltoks[process_cl])!=0){
                        for(k=1;k<=flds_rd;k++){
                            ltoks[k] = strupper(trmstr(ltoks[k]));
                        }
```

```
                    load_struc(flds_rd,ltoks,sprdsht,line-header_lns,filename,header_lns);
                    line ++;
                }
            }
            }else{
                header[line] = Strdup(msg);
            line++;
            }
        }; /* End while read of file */
/*      sslns = line-header_lis-1; */
        line_adj = header_ins + 1;
            printf("Total Lines Read= %i: Fields per line = %i\n",line,flds_rd);
            printf("\n");
            fclose(fptr);
/*          fix_suffix(sprdsht,sslns); */
            if(check_spreadsheet(sprdsht,sslns) != 0){
                printf("**Error Fatal Error You must fix your spreadsheet to continue.\n");
                exit(9);
            }
            status = order_bits(sprdsht,sslns);
            find_chain_ends(sprdsht,sslns);
            bmm = bufmm_start;
            while (bmm){
                if (strcmp(bmm->bufmmname,common_bmm)){
                    bidis_bool = bmm->bidi_bool;
                    init_chain_vars(bmm, sprdsht);
                }
                bmm = bmm->next;
            }
            bmm = bufmm_start;
            printf("Enter Pathname for Output Files or Return for current directory:\n");
            gets(bpathname);         /* get and format output path */
            strupper(trmstr(bpathname));
            if(strlen_pathname) >0 && bpathname[strlen(bpathname)-1]!= '\\'){
                strcat(bpathname,bkslash);
            }
/* Walk through the list of buffer midmacros and write out the bdl */
            while (bmm){
                if (strcmp(bmm->bufmmname,common_bmm)){
                    bidis_bool = bmm->bidi_bool;
/*                  bidis_bool = 'T';       Temporary */
                    strcpy_filename,bpathname);
                    strcat(bfilename,asic_name);
                        strcat(bfilename,bmm->bufmmname);
                        strcat(bfilename,bdlext);
                        printf("BDL filename= %s\n", bfilename);
                        fbptr = fopen(bfilename,"w");
/* printf("%i\n",fptr); /* open file */
                        if(fbptr == NULL){
                            printf("Error in opening file %s: Terminating Program 0\n:",
                            bfilename);
                            perror(filename);
                        };
/*      gets(brk); */
                    ins = AVLCreate(StringCompare);
                    outs = AVLCreate(StringCompare);
                    bdl_conn_terms(sprdsht,bmm->bufmmname,sslns);
                    status = wr_out_bdl(sprdsht, bmm->bufmmname,
                        fbptr, prog_rev,sslns);
                    fclose(fbptr);
                    AvLDestroy(ins);
                    AVLDestroy(outs);
                    if(gen_add_log = = 'T'){
                      strcpy_filename,bpathname);
                      strcat(bfilename,asic_name);
                      strcat(bfilename,bmm->bufmmname);
                      strcat(bfilename,addlext);
                      printf("Add logic filename= %s\n", bfilename);
                      faptr = fopen(bfilename,"w");
/* printf("%i\n",fptr); /* open file */
                        if(fbptr = = NULL){
                            printf("Error in opening flie %s: Terminating Program 0\n:",
                            bfilename);
                            perror(filename);
                            };
                        wr_out_addl(sprdsht, bmm->bufmmname,faptr,sslns);
                        fclose(faptr);
                    }
                }
```

-continued

```
                bmm = bmm->next;
            }
/*      foptr = out_file(ofilename); */
            strcpy(ofilename,bpathname);
            strcat(ofilename,asic_name);
            strcat(ofilename,hputext);
            foptr = fopen(ofilename,"w");
/* printf("%i\n",fptr); /* open file */
        if(foptr == NULL){
                printf("Error in opening file %s: Terminating Program 0\n:",
                    ofilename);
                perror(ofilename);
            };
            printf("APUT filename= %s\n", ofilename);
            status = output_pinscr(sprdsht,sslns,foptr);
            fclose(foptr);
            printf("\n");
            printf("Note !!! These buffers no longer have to be compiled\n");
            printf("with the –uncheck option");
            printf("\n");
printf("\n");
printf("Bufgen Completed Successfully\n");
}
        /* End of Main */
void load_struc(int flds_rd,char *ltoks[ ],ROW *sprdsht[ ],int param_line,
        char* filename,int header_lns)
/*  This function load the global spreadsheet stuct from the ltoks array
    csvparse parses the lines and load_struc operates on its output ltoks */
    {
    int 1 = 0;
    int j = 0;
    int done = 1;
    int line = 0;
    char inp_str[3] = "IN";
    char out_str[4] = "OUT";
    char bidi_str[3] = "BI";
    char *spare_str = "SPARE_";
    char spare_name[22] = " ";
    RULE *prev_ptr;
    RULE *new_ptr;
    BUFLL *prev_bptr;
    BUFLL *new_bptr;
    BUFMM *r = NULL;
    BUFMM *nextptr = NULL;
        if (flds_rd >= 1 && ((scan_ord_cl!=0 && ltoks[scan_ord_cl]&&
*ltoks[scan_ord_cl]!='\0')||
            scan_ord_d==0)){
                if (scan_ord_cl!=0 && *ltoks[scan_ord_cl]!='\0') {
                    line = atoi(ltoks[scan_ord_cl])-1;
                }else{
                    line = param_line;
                }
                if (line>=0 && line<=1020){
            if(sprdsht[line]==NULL){
                    sprdsht[line] = calloc(1,sizeof(*sprdsht[line]));
                }else{
                    printf("**Error* Duplicate scan bit %i specified in rows %i & %i column
%i\n",
                    line+1,sprdsht[line]->ssln_no, param_line+header_lns+1, scan_ord_cl);
                    printf(" Discarding data on row %i and continuing run to look for more
errors.\n",
                        param_line+header_lns+1);
                    return;
            }
                if (sprdsht[line] == NULL){
                    printf("ERROR You Ran out of Memory on line %i of file
%s\n",
                    line+header_lns,*filename);
                    exit(9);
                }
            }else{
                printf("ERROR Your Scan String Order in row %i column %i is out
of range\n",
                    param_line+header_lns,scan_ord_cl);
                exit(9);
            }
        sprdsht[line]->ssln_no = param_line+header_lns +1;
            bidis_bool = 'F';
            if(sslns<line){
```

```
                sslns = line;
            }
            if (flds_rd >= direct_cl && *ltoks[direct_cl]!='\0') {
                if (strcmp(ltoks[direct_cl],inp_str)== 0)
                    sprdsht[line]->direction = 'I';
                else{
                    if(strcmp(ltoks[direct_cl],out_str)== 0)
                        sprdsht[line]->direction = 'O';
                    else{
                        if(strcmp(ltoks[direct_cl],bidi_str)== 0){
                            sprdsht[line]->direction = 'B';
                            bidis_bool = 'T';
                        }else{
                    printf("**ERROR* Unrecognizeable direction %s on %s tenninal line %i\n",
                        ltoks[direct_cl], ltoks[term_cl], sprdsht[line]->ssln_no);
                            sprdsht[line]->direction = '\0';
                        }
                    }
                }
            }else {
                sprdsht[line]->direction = '\0';
/*              printf("**ERROR* No direction data in spreadsheet on %s terminal line %i\n",
                 ltoks[term_cl],line); */
            }
            if (strlen(trmstr(ltoks[term_cl]))== 0){
                if (sprdsht[line]->direction !='\0'){
                    strcpy(spare_name,spare_str);           /* label it spare */
                    if (strlen(trmstr(ltoks[pad_cl]))!=0){
                        strcat(spare_name,tstrupper(ltoks[pad_cl]));
                sprdsht[line]->tname = Strdup(spare_name);
                    }else{
                        printf("Error Missing pad name in row %i of spreadsheet\n",
                            sprdsht[line]->ssln_no);
            printf("The terminal name for this line will be illegal\n");
                        sprdsht[line]->tname = Strdup(spare_name);
                    }
                }else{
                    sprdsht[line]->tname = Strdup(" "); /* No entry VSS etc */
                }
            }else{
                sprdsht[line]->tname = Strdup(tstrupper(ltoks[term_cl]));
            }
            if (flds_rd >= input_cl) {
                sprdsht[line]->input = Strdup(ltoks[input_cl]);
            }else{
                sprdsht[line]->input = Strdup(" ");
/*              printf("**ERROR* No input terminal data in spreadsheet on %s terminal\n",
                 ltoks[term_cl]); */
            }
            if (flds_rd >= output_cl) {
                sprdsht[line]->output = Strdup(tstrupper(trmstr(ltoks[output_cl])));
            }else{
                sprdsht[line]->output = Strdup(" ");
/*          printf("**ERROR* No output terminal data in spreadsheet on %s terminal\n",
                 ltoks[term_cl]); */
            }
            if (flds_rd >= bit_cl) {
                sprdsht[line]->bit_no = Strdup(ltoks[bit_cl]);
            }else{
                sprdsht[llne]->bit_no = Strdup(" ");
            }
            if ((flds_rd >= bufvar_cl[0]) && (bufvars>=0)) { /* form linked list of sprdsht
variables */
/*          printf("%s\n",ltoks[9]); */
/*          trmstr(ltoks[9]); */
/*          printf("%s %i\n",ltoks[9],strlen(ltoks[9])); */
                for (j=0;j<=bufvars;j++){
                    new_bptr = calloc(1,sizeof(*prev_bptr));
                    if (new_bptr == NULL){
                        printf("ERROR You Ran out of Memory on line %i
of file %s",
                        sprdsht[line]->ssin_no,*filename);
                        exit(9);
                    }
                    if(!sprdsht[line]->buf_start){
                        sprdsht[line]->buf_start = new_bptr;
                    }else{
                        prev_bptr->next = new_bptr;
                    }
```

-continued

```
                    new_bptr->buf = get_bufr_ptr(strupper(ltoks[bufvar_cl[j]]));
                    if(new_bptr->buf= =NULL && strlen(ltoks[bufvar_cl[j]])!= 0){
                        printf("Error Buffer No %i Type %s Not Defined in Rules
File\n",
                            j, ltoks[bufvar_cl[j]]);
                        printf("** Spreadsheet Line %i\n",sprdsht[line]->ssln_no);
                    }
                    new_bptr->next = NULL;
                    prev_bptr = new_bptr;
/* printf("column %istring%s\n",ssvar_cl[j],sprdsht[line]>ssvar_start-
>connect_str); */
                }
            }else{
                sprdsht[line]->buf_start = NULL;
                printf("**ERROR* No buffer data in spreadsheet on %s terminal\n",
                 ltoks[term_cl]);
            }
            if (flds_rd >= pin_cl) {
                sprdsht[line]->pin = Strdup(ltoks[pin_cl]);
            }else{
                sprdsht[line]->pin = Strdup(" ");
            }
            if (flds_rd >= pad_cl) {
                sprdsht[line]->pad = Strdup(ltoks[pad_cl]);
            }else{
                sprdsht[line]->pad = Strdup(" ");
            }
            if (flds_rd >= bump_cl) {
                sprdsht[line]->bump = Strdup(ltoks[bump_cl]);
            }else{
                sprdsht[line]->bump = Strdup(" ");
            }
            if (flds_rd >= flags_cl) {
                sprdsht[line]->flags = Strdup(ltoks[flags_cl]);
            }else{
                sprdsht[line]->flags = Strdup(" ");
            }
            /* Create linked list of bits in vector */
            sprdsht[line]->nextbit = -1;
            sprdsht[line]->hdrf = '\0';
            /* Check for integer value of bit number */
            if (*sprdsht[line]->bit_no != '\0') {
                if (isdigit(*sprdsht[line]->bit_no)==0){
                    printf("**ERROR Bit number '%s' for %s is not an integer\n",
                    sprdsht[line]->bit_no,sprdsht[line]->tname);
            }else{
                    if(line > 0){
                        done=0;
                    };
                    1=0;
                    while (done==0){
                        if (l!=line && sprdsht[1]&& strncmp(sprdsht[line]-
>tname,sprdsht[1]->tname,30)==0){
                        /* Update header or first bit found to last bit processed */
            if(line>1){
                            sprdsht[line]->nextbit = sprdsht[1]->nextbit;
                            sprdsht[1]->nextbit = line;
                            sprdsht[1]->hdrf = 'T';
                            done = 1;
/*                  printf("%i %s[%s]%i %c\n",line,sprdsht[line]->tname,
                    sprdsht[line]->bit_no,sprdsht[line]->nextbit,
                    sprdsht[line]->direction); */
                        }else{
/* When spreadsheet is read in unordered higher locations in the array
can be read in first. The hdrf alway need to be on the first bit */
                            sprdsht[line]->hdrf = 'T';
                            sprdsht[1]->hdrf = '\0';
                            sprdsht[line]->nextbit = 1;
                            done =1;
        }
                        }else{
                            if (1>=ssins){
                                done=1;
                                sprdsht[line]->hdrf = 'T';
                            }else{
                                1++;
                            }
                        }
                    }
```

-continued

```
                }
            }
        sprdsht[line]->chkd = '\0';
        if (flds_rd >= bufmm_cl) {
                sprdsht[line]->bfmm = Strdup(ltoks[bufmm_cl]);
                r = get_bufmm_ptr(sprdsht[line]->bfmm);
                if(!r){
                        tot_bufmm++;
                        nextptr = calloc(1,sizeof(BUFMM));
                        if (nextptr == NULL){
                                printf("ERROR You Ran out of Memory on line %i
of file %s\n",
                                sprdsht[line]->ssln_no,*filename);
                                exit(9);
                        }
                        nextptr->bufmmname = Strtreedup(ltoks[bufmm_cl]);
                        nextptr->next = NULL;
                        printf("Defining Buffer Midmacro name = %s\n",
                                nextptr->bufmmname);
                        if (bmm_lastptr){
                                bmm_lastptr->next = nextptr;
                        }else{
                                bufmm_start = nextptr;
                        }
                        bmm_lastptr = nextptr;
                                if(bidis_bool == 'T'){
                                        nextptr->bidi_bool = 'T';
                                }else{
                                        nextptr->bid_bool = 'F';
                                }
                        }else{
                                if(bidis_bool == 'T'){
                                        r->bidi_bool = 'T';
                                }
                        }
                }
            }else{
                sprdsht[line]->bfmm = Strdup(" ");
                printf("Error There is no buffer midmacro specified for line %i of file
%s\n",
                sprdsht[line]->ssln_no,*filename);
            }
            if ((flds_rd >= 8+ssvars) && (ssvars>=0)) { /* form linked list of sprdsht variables
*/
/*          printf("%s\n",ltoks[9]); */
/*          trmstr(ltoks[9]); */
/*          printf("%s %i\n",ltoks[9],strlen(ltoks[9])); */
                    for (j=0;j<=ssvars;j++){
                            new_ptr = calloc(1,sizeof(*prev_ptr));
                            if (new_ptr = = NULL){
                                printf("ERROR You Ran out of Memory on line %i
of file %s",
                                sprdsht[line]->ssln no,*filename);
                                exit(9);
                            }
                            if(!sprdsht[line]->ssvar_start){
                                sprdsht[line]->ssvar_start = new_ptr;
                            }else{
                                prev_ptr->next = new_ptr;
                            }
                            new_ptr->connect_str = Strtreedup(ltoks[ssvar_cl[j]]);
                            new_ptr->next = NULL;
                            prev_ptr = new_ptr;
/*                          printf("column %istring%s\n",ssvar_cl[j],sprdsht[line]->ssvar_start-
>connect_str); */
                    }
                }else{
                    sprdsht[line]->ssvar_start = NULL;
                }
        } /* End of if something in line and scan_ord_col */
}
BUFFER *get_bufr_ptr(char *bname)
/* This function searches the list of available buffer macros and returns
the pointer to the struct with the same name buffer */
{
            int i = 1;
            int done = 0;
            BUFFER *r = NULL;
        if (*bname == '\0') done = 1;
            while (i<= tot_macros && !done){
```

```
                if (strcmp(bflist[i]->bufname, bname) == 0){
                    r = bflist[i];
                    done = 1;
            }
                    i++;
            }
                    return(r);
}
BUFMM *get_bufmm_ptr(char *bname)
/* This function searches the list of available buffer midmacros
and returns the pointer to the struct with the same name buffer */
{
                    int done = 0;
                    BUFMM *r = NULL;
        r = bufmm_start;
        if (*bname == '\0') done = 1;
                while (r && !done){
                    if (strcmp(r->bufmmname, bname) == 0){
                      done = 1;
                    }else{
                      r = r->next;
                    }
                }
                    return(r);
}
void fix_suffix(ROW *sprdsht[ ],int slines)
/* This function reads in a correction file and substitutes the original
suffix on the tname for the T suffix and checks that each terminal exists
in both the struc and the correction file. Input is the array of pointers
to the struc, the number of entries in the struc. */
{
char l[20];
int i = 0;
int flds_rd = 0;
int done = 0;
int line = 1;
int header_lns = 1;
char msg[150] = " ";
char *ltoks[20];
char *tname;
char *bit_no;
char *lcharptr;
char lchar;
FILE *fptr;
char filename[52] = "c:\\bufgen\\pl.csv";
            printf("Enter Your Interface Correction Filename:");
            gets(filename); /* open for reading */
            printf("\n");
            fptr = fopen(filename,"r"); /* open file */
/*          printf("%i\n",fptr); /* debug */
            if(fptr == NULL){
            printf("Error in opening file %s: Terminating Program\n:",filename);
            perror(filename);
            exit(9);
            }
            while (fgets(msg, 200, fptr) != NULL) {    /* read a string from the file */
/*              printf("msg1 = %s", msg);                          /* debug display
*/
                if (strlen(msg) > 199){
                  printf("** Error * The following input string length too long.\n");
                  printf("%s",msg);
                };
                flds_rd = csvparse(msg,ltoks);     /* parse it and return the number of
                  tokens or pointers to the tokens */
/*              printf("tok1= %s\n",ltoks[1]); /* debug */
                if (line > header_lns && flds_rd >= 1){
                    tname = Strdup(trmstr(ltoks[1]));
            lcharptr = strchr(tname,0)-1;
                lchar = *lcharptr;
                if (flds_rd >= 2){
                    bit_no = Strdup(trmstr(ltoks[2]));
                }else{
                    bit_no = NULL;
            };
                if (lchar == 'T'){
printf("Error Invalid suffix character T in the terminal correction name:\n");
printf(" %s[%s]\n", tname, bit_no);
                }
/*              printf ("%s, %c", tname,lchar); */
```

```
                    *lcharptr = 'T';
/*                  printf (">>%s, %c\n", tname,lchar); */
                    done = 0;
                    i= 0;
                    while (i<= slines && done == 0) {
                        if (strcmp(tname,sprdsht[i]->tname) == 0 &&
                            strcmp(bit_no,sprdsht[i]->bit_no) == 0) {
                            * (strchr(sprdsht[i]->tname,0)-1) = lchar;
                                sprdsht[i]->chkd = 'T';
                                done = 1;
                            }
                            i++;
                        }
                }
            line ++;
                }
                fclose(fptr);
                for (i=0;i<= slines;i++){       /* chk for uncorrected terminals */
                    if (sprdsht[i]->chkd == '\0'){
printf("Warning The following terminal from your spreadsheet was\n");
printf("not in your conection file: %s[%s]\n", sprdsht[i]->tname,
                    sprdsht[i]->bit_no);
                    }
                }
                gets(1);
}
/* ******************************************************************* */
int order_bits(ROW *iflist[ ],int terms)
/* This fanction takes in a pointer to the spreadsheet structure
   and orders the bits in bit_no. It needs the hdrf
   header flag field */
{
            int i = 0;
            int hdr = 0;
            int next = 0;
            int done = 0;
            int j = 0;
            int nextpls = 0;
            int temp = 0;
            for (i=0; i<= terms; i++){
/* printf ("order bits in row %i\n",i); */
                if (iflist[i]->bdrf){
                    hdr = i;
                if (iflist[hdr]->nextbit >= 0){
                    done = 0;
                }else{
                    done = 1; /* Single bit vector */
                }
                while (done == 0){
                    done = 1;
                    next = iflist[hdr]->nextbit;
                    if (atoi(iflist[hdr]->bit_no) > atoi(iflist[next]->bit_no)){
                        done = 0;
                        iflist[hdr]->hdrf = '\0';      /* remove header pointer */
                        temp = hdr;
                        iflist[hdr]>nextbit = iflist[next]->nextbit;
                        hdr = next;
                        iflist[next]->nextbit = temp;
                            next = iflist[hdr]->nextbit;
/*  printf(hdr=%i, next= %i nextpls= %i\n", hdr, iflist[hdr]->nextbit,
                        iflist[next]->nextbit);
    gets(brk); */
                    }
                    j=hdr;
                    while (iflist[j]->nextbit >= 0 &&
                        iflist[iflist[j]->nextbit]->nextbit >= 0){
                        next = iflist[j]->nextbit;
                        nextpls = iflist[next]->nextbit;
/*  printf("j=%i, next= %i nextpls= %i nb= %i\n",j, iflist[j]->nextbit, iflist[next]->nextbit,
                        iflist[nextpls]->nextbit); */
                        if (*iflist[i]->bit_no != '\0'){
/*                          printf("%i %s[%s]%i %c ckd=%c\n",i,iflist[i]->tname,
                            iflist[i]->bit_no,iflist[i]->nextbit,iflist[i]->hdrf,
                            iflist[i]->chkd); */
                        }
                        if (atoi(iflist[next]->bit_no) > atoi(iflist[nextpls]->bit_no)){
                            done = 0;
                            temp = iflist[j]->nextbit;
                            iflist[j]->nextbit = iflist[next]->nextbit;
```

-continued

```
                        iflist[next]->nextbit = iflist[nextpls]->nextbit;
                        iflist[nextpls]->nextbit = temp;
                    }
/* printf("j=%i, next= %i nextpts= %i nextpls->nb= %i\n",j, iflist[j]->nextbit, iflist[next]->nextbit,
                    iflist[nextpls]->nextbit);
                    gets(brk); */
                    j=iflist[j]->nextbit;
/*                  cnt++; */
                    } /* end while to end of list */
                } /* end while done */
                iflist[hdr]->hdrf = 'T';
            } /* end if */
        } /* end for loop */
/* Check for duplicate bits in vectors */
        for (i=0; i<= terms; i++){
            if (iflist[i]->hdrf){
            hdr = i;
        if (iflist[hdr]->nextbit >= 0){
                done = 0;
            }else{
                done = 1; /* Single bit vector */
        }
                j=hdr;
                while (iflist[j]->nextbit >= 0 &&
                    iflist[iflist[j]->nextbit]->nextbit >= 0){
                    next = iflist[j]->nextbit;
                    nextpls = iflist[next]->nextbit;
                    if (atoi(iflist[next]->bit_no) == atoi(iflist[nextpls]->bit_no)){
                        printf("Error Vector Terminal %s has duplicate bit %s\n",
                        iflist[next]->tname,iflist[next]->bit_no);
                        printf(" Lines %i and %i of spreadsheet\n", iflist[next]->ssln_no,
                        ifist[nextpls]->ssln_no);
                        screen_lns = screen_lns +2;
                        if (screen_lns >= 20){
                            printf("Continue? Hit return:");
                            gets(brk);
                            printf("\n");
                    screen_lns = 0;
        }
                    }
                    j = iflist[j]->nextbit;
                } /* End while */
        } /* End if header */
        } /* End for loop */
/* debug printout vector entries in struct */
/*      for (i=0;i<=terms;i++){
                if(*iflist[i]->bit_no != '\0'){
                    printf("%i %s[%s]%i %c ckd=%c\n",i,iflist[i]->tname,
                    list[i]->bit_no,iflist[i]->nextbit,iflist[i]->hdrf,
                    iflist[i]->chkd);
                }
            } */
} /* end order bits */
/* ******************************************************************* */
void prog_header(char *prog_header,char *prog_rev,char *update)
/*  This function prints: out the program name rev and update date at the
    start of the run */
{
        time_t t;
    t = time(NULL);
        printf("Program: %s Rev: %s Updated: %s %s\n",
        prog_header, prog_rev, update, ctime(&t));
}
FILE *open_file(char *filename)
/*  This function queries for the CSV spreadsheet file and opens it for
    reading */
{
        FILE *fptr;
        printf("Enter Your Spreadsheet CSV Format Filename:");
        gets(filename); /* open for reading */
        printf("\n");
        fptr = fopen(filename,"r"); /* open file */
/*      printf("%i\n",fptr); /* debug */
        if(fptr == NULL){
        printf("Error in opening file %s: Terminating Program\n:",filename);
        perror(filename);
        exit(9);
        }
        return(fptr);
```

```
        }
        FILE *out_file(char *filename)
        /* This function queries the user for the output script file name and
        opens it for writing */
        {
            FILE *fptr;
            printf("Enter Your Script Output Filename: ");
            gets(filename); /* open for writing */
            printf("\n");
            fptr = fopen(filename,"w");
        /* printf("%i\n",fptr); /* open file */
            if(fptr == NULL){
                printf("Error in opening file %s: Terminating Program 0\n:",filename);
                perror(filename);
                exit(9);
            }
            return(fptr);
        }
int csvparse(char *s, char *tkn[ ])
/* This function takes in a string or line in spreadsheet csv format
and returns an array of pointers to the elements of the line up to 30
fields. Fields are less than 30. The token array starts at array element
one */
{
            int fld = 1;
        int pos = 0;
            while (fld <= 30 && s[pos]){
                if(s[pos] == '\"'){  /* if quoted field get it */
                    pos++;        /* increment past first quote */
                tkn[fld] = &s[pos];              /* set tkn to first char of field */
                    /* find end of field */
                while(s[pos]&& s[pos]!= '\"'){
                  if(s[pos] = = '\n') s[pos] = 0; /* terinate w/o new lines */
                pos++;
                        };
                if(s[pos]){      /* if not at end of line */
                s[pos] = 0;   /* terminate token */
                    pos += 2;    /* go to start of next token */
                    };
            }else{            /* else get comma delim field */
                tkn[fld] = &s[pos];      /* set tkn to first char of field */
                        /* find end of field */
                    while(s[pos]&& s[pos]!= ','){
                        if(s[pos] == '\n') s[pos] = 0; /* terminate w/o new lines */
                    pos++;
                        };
                    if(s[pos]){          /* if not at end of line */
                    s[pos] = 0;     /* terminate token */
                        pos++;              /* go to start of next token */
                    };
                    };
            fld++;
                };
                                    return(fld-1); /* return new token */
}
int output_pinscr(ROW *iflist[0],int pins,FILE *fptr)
/* This function takes in a pointer to the spreadsheet structure and
outputs an HPUT format pin assignment script. */
{
            int i = 0;
            /* format output examples
            *PAS
            terminal_name port_name pin_name board_conn assignment_state
            breg[0]  a55     a55 bcna    F
            areg         20                !         *          M
            *LSSD
    terminal_name lssd_flags
            note: * represents a blank field.
                  ! represents no change field
    */
            fprintf(fptr,"*PAS\n");
            for ( i=0; i<= pins; i++){
        if (*iflist[i]->tname != '\0'){
          if (*(iflist[i]->bit_no)){
                    fprintf(fptr,"%s[%s]%s %s * F\n",iflist[i]->tname,
                    iflist[i]->bit_no, iflist[i]->pad, iflist[i]->pin);
                    }else{
                    fprintf(fptr,"%s %s %s * F\n",iflist[i]->tname,
                    iflist[i]->pad, iflist[i]->pin);
```

```
                    }
                }
            };
            fprintf(fptr,"*LSSD\n");
            for ( i=0; i<= pins ; i++){
                if(*iflist[i]->tname != '\0'){
        if (*(iflist[i]->bit_no)){
                    fprintf(fptr,"%s[%s]%s\n",iflist[i]->tname,
                    iflist[i]->bit_no, iflist[i]->flags);
                }else{
                    fprintf(fptr,"%s %s\n",iflist[i]->tname,
                    iflist[i]>flags);
                }
        }
            }
        return (1);
}
/*                              */
/*  DETAILED DESIGN:                              */
/*                              */
/*  given the address of a string,            */
/*  find the first nonblank character (start_char)        */
/*  find the end ('\0') character (end_char)        */
/*  find the last non-blank character prior to '\0' (last_char)    */
/*  move start_char to last_char to start at char 0        */
/*  end the string with '\0'                */
/*                              */
/* ********** INCLUDE LIBRARIES, CONSTANTS, STRUCTURES **************** */
#include <stdio.h>
#include <ctype.h>
#include <string.h>
/* #include "basic.define" */
/* *********************************************************************** */
/* *********************************************************************** */
char *trmstr(char *t_string)
{
/* ************************** LOCAL VARIABLES ********************** */
    int i,dbug;
    int start_char = 0;
    int end_char= 0;
        int last_char= 0;
    dbug = 0;
    if (dbug) printf("TRMSTR: INITIAL STRING: '%s'\n",t_string);
    i = 0;
    while (*(t_string+i) != '\0') {
        if (t_string[i]=='\n') {
                    *(t_string+i)= '\0';
            end_char = i;
        } else i++;
            }
            end_char = i;
    start_char = 0;
    while (t_string[start_char] == ' ') start_char++;
    last_char = end_char-1;
            for (i = end_char-1; i >= 0; i--){
                if (t_string[i]<= ' ') {
        last_char = i;
        i = 0; /* stop loop */
                }
            }
            t_string[last_char+1] = '\0';
            if (start_char){    /* shift string to left */
        i=0;
                while (t_string[i+start_char]!= '\0'){
                    t_string[i] = t_string[i+start_char];
        i++;
                }
    }
                t_string[i] = t_string[i+start_char];
/*  t_string = t_string+start_char; */
    if (dbug) printf("TRMSTR: FINAL STRING: '%s'\n",t_string);
    if (dbug) printf("TRMSTR: start_char : %i\n",start_char);
    if (dbug) printf("TRMSTR: end_char : %i\n",end_char);
    if (dbug) printf("TRMSTR: last_char : %i\n",last_char);
        return(t_string);
}
char *Strdup(char *s)
/* This function is like strdup but does the check for memory allocation
error */
```

-continued

```
{
        char *r;
        r=calloc(1,strlen(s)+1);
        if(r == NULL){
                printf("ERROR You Ran out of Memory allocating storage for %s",
                *s);
                exit(9);
        }
        strcpy(r,s);
        return(r);
}
#include <ctype.h>
char *tstrupper(char *s)
/* This function creates a temporary upper case string that can
be Strduped or printed but does not disturb the original string.*/
{
        static char caps[200];
    int i=0;
        if (strlen(s) > 200){
                printf("**Error* Input String % \n too long for tstrupper function.",
                s);
        }else{
            while (s[i]!= '\0'){
              caps[i] = toupper(s[i]);
              i++;
            };
            caps[i] = '\0';
    };
    return(caps);
}
char *tstrsufx(char *s, char suffix)
/* This function creates a temporary string with the last character replaced can
with suffix which can he Strduped or printed but does not disturb the
original string.*/
{
        static char caps[80];
        if (strlen(s) > 79){
                printf("**Error* Input String % \n too long for tstrsufx function.",
                s);
        }else{
                strcpy(caps,s);
                caps[strlen(s)-1] = suffix;
        };
    return(caps);
}
char *tstripver(char *s)
/* This function creates a temporary upper case string that can
be Strduped or printed but does not disturb the original string.*/
{
        static char caps[80];
        if (strlen(s) > 79){
                printf("**Error* Input String % \n too long for tstripver function.",
                s);
        }else{
                strcpy(caps,s);
                strtok(caps,"/");
        };
    return(caps);
}
#include <ctype.h>
char *strupper(char *s)
/* This function changes a the string pointed to to upper case
is the original string is changed.*/
{
    int i=0;
        while (s[i] != '\0'){
                s[i] = toupper(s[i]);
                i++;
    };
    return(s);
}
/* ****************************************************************  */
/* ****************************************************************  */
int StringCompare(const void *p1,const void *p2)
{
        return strcmp((char *)p1,(char *)p2);
}
char *Strtreedup(char *s)
{
```

```
        char *r;
        static AVLTREE *t = NULL;
        if(!t){
                t = AVLCreate(StringCompare);
        }
        r = AVLFind(t,s);
        if(!r){
                r = Calloc(1,strlen(s)+1);
                strcpy(r,s);
                AVLInsert(t,r);
        }
        return r;
}
void *Calloc(size_t n,size_t s)
{
        void *ptr;
        ptr = calloc(n,s);
        if (!ptr){
                printf("** Fatal Error ** Out of Memory\n");
                exit(9);
        }
        return ptr;
}
AVLTREE *AVLCreate(int (*c)(const void *,const void *))
{
    AVLTREE *t;
    t = calloc(1,sizeof(*t));
    t->compare = c;
    return t;
}
void AVLDestroyNodes(TREERECORD *r)
{
        if(!r) return;
        AVLDestroyNodes(r->right);
        AVLDestroyNodes(r->left);
/*      free(r->m); */
        free(r);
}
void AVLDestroy(AVLTREE *t)
{
        AvLDestroyNodes(t->t);
        free(t);
}
TREERECORD *AVLbalance(AVLTREE *tree,TREERECORD *a)
{
    TREERECORD *b,*c;
    /*determmne the rotation type to balance */
    if (a->bf== +2){          /* left unbalenced */
        b = a->left;     /* make b point to right of head */
                        if (b->bf== +1){/* rotation of type LL */
            a->left = b->right;
            b->right = a;
            a->bf = 0;
            b->bf = 0;    /* the LR case */
        }else{
            c=b->right;
            a->right = c->left;
            a->left = c->right;
            c->left = b;
            c->right = a;
            switch (c->bf) {
            case +1: /* LR(b) */
                a->bf = -1;
                b->bf = 0;
                break;
            case-1: /*LR(c) */
                b->bf = +1;
                a->bf = 0;
                break;
            case 0: /* LR(a) */
                b->bf = 0;
                a->bf = 0;
                break;
            } /* end of switch */
            c->bf = 0;
            b = c;    /* b is the new root */
        }
    }else
                if (a->bf = = -2){       /* right unbalenced */
```

```
            b = a->right;    /* make b point to left of head */
            if (b->bf== -1){    /* rotation of RR type */
                a->right = b->left;
                b->left = a;
                a->bf = 0;
                b->bf = 0;
            }else{            /* the RL case */
                    c = b->left;
                b->left = ->right;
                a->right = c->left;
                c->right = b;
                c->left = a;
                switch (c->bf){
                case -1: /* RL(b) */
                    a->bf= +1;
                    b->bf = 0;
                    break;
                case 1: /* RL(c) */
                    b->bf = -1;
                    a->bf = 0;
                    break;
                case 0: /* RL(a) */
                    b->bf = 0;
                    a->bf = 0;
                    break;
                }
                c->bf = 0;
                b = c;    /*b is the new root */
            }
        }else b = a;
        return(b);
}
void AVLInsert(AVLTREE *tree,void *x)
{
    TREERECORD *a,*f,*p,*q;
    int j;
    int unbalanced;
            int d;
            enum {false,true};
    if (tree->t == NULL){
        /* special case, t is an empty tree */
        tree->t = tree->cc = calloc(1,sizeof(*tree->t));
        tree->cc->m = x;
        tree->cc->bf = 0;
        tree->cc->left = NULL;
        tree->cc->right = NULL;
                return;
    }
        /* Search t to see if x is in it */
        a points to the last node with a +/-1 balance factor */
        /* f points to the parent of a */
        /* q points to the parent of p */
        /* p is the current node being looked at as we traverse the tree */
f = NULL;
a = tree->t;
p = tree->t;
q = NULL;
while(p){
    if(p->bf != 0){
        a = p;
        f = q;
    }
    j = tree->compare(x,->m);
    if(j < 0){        /* take the left child path */
        q = p;
        p = p->left;
    }else
    if(j > 0){        /* take the right child path */
        q = p;
        p = ->right;
    }else{
        AVLFind(tree,x);
        return;
    }
}
/* insert the new node as the appropriate child of q to contain x
and then rebalance the tree */
tree->cc = calloc(1,sizeof(*tree->t));
tree->cc->left = NULL;
```

```
-continued tree->cc->right = NULL;
tree->->bf = 0;
tree->->m=x;
if (j < 0) q->left = tree->cc;
else        q->right = tree->cc;
        /* now adjust the balance factors bf on the path from a to q. */
        p = a;
while (p != tree->cc){
    j = tree->compare(x,p->m);
    if(j > 0){
        /*height of right increases by 1 */
                p->bf -= 1;
                p = p->right;
            }else{
                /* height of left increases by 1 */
                p->bf += 1;
            p = p->left;
    }
}
    if(abs(a->bf) < 2){         /* if still in balance */
        return;                 /* return */
    }
    if (f = = NULL)    tree->t = AVLbalance(tree,a);
    else
    if (a == f->left)    f->left = AVLbalance(tree,a);
    else
    if(a = = f->right)   f->right = AVLbalance(tree,a);
    AVLFind(tree,x);
}
void *AVLFind(AVLTREE *t,void *r) /* returns pointer if it finds */
{                               /* returns NULL if no find*/
    TREERECORD *p;
    int j;
    t->sp = 0;          /* Pop All enteries from stack pointer */
    p = t->t;
    while(p){
        t->st[t->sp++] = p;
        j = t->compare(r,p->m);
        if(j < 0){
            p = p->left;
        }else
        if(j > 0){
            p = p->right;
        }else{
            t->cc = p;
            return p->m;
        }
    }
    return NULL;
}
void *AVLFirst(AVLTREE *t)
{
    TREERECORD *c;
    if(!t->t) return NULL;
    c = t->t;           /* initialize current node */
    t->sp = ;
    while(c){           /* travel all the way left while pushing nodes */
        t->st[t->sp++] = c;
        c = c->left;
    }
    t->oc = t->st[--t->sp];
    return(t->->m);
}
void *AVLLast(AVLTREE *t)
{
    TREERECORD *c;
    if(!t->t) return NULL;
    c = t->t;           /* initialize current node */
    t->sp = 0;
    while(c){           /* travel all the way right while pushing nodes */
        t->st[t->sp++] = c;
        c = c->right;
    }
    t->cc = t->st[--t->sp];
    return(t->cc->m);
}
void *AVLNext(AVLTREE *t)
{
    TREERECORD *c;
```

```
        if(!t->cc) return(NULL);
        if(t->cc->right){
            t->st[t->sp++] = t->cc;
            t->cc = t->cc->right;
            t->st[t->sp++] = t->cc;
            t->cc = t->->left;
            while(t->cc){
                t->st[t->sp++] = t->cc;
                t->cc = t->->left;
            }
            t->cc = t->st[--t->sp];
        }else{
            if(t->sp == 0) {
                c = NULL;
            }else{
                c = t->st[--t->sp];
            }
            while(c && t->compare(c->m,t->cc->m) < 0){
                if(t->sp == 0){
                    c = NULL;
                }else{
                    c = t->st[--t->sp];
                }
            }
            t->cc = c;
        }
        if(t->cc) return(t->cc->m);
        else{
            AVLLast(t);
            return NULL;
        }
}
void *AVLPrev(AVLTREE *t)
{
    TREERECORD *c;
    if(!t->cc) return(NULL);
    if(t->cc->left){
        t->st[t->sp++] = t->cc;
        t->cc = t->cc->left;
        t->st[t->sp++] = t->cc;
        t->cc = t->cc->right;
        while(t->cc){
            t->st[t->sp++] = t->cc;
            t->cc = t->->right;
        }
        t->cc = t->st[--t->sp];
    }else{
        if(t->sp == 0){
            c = NULL;
        }else{
            c = t->st[--t->sp];
        }
        while(c && t->compare(->m,t->cc->m) > 0){
            if(t->sp == 0){
                c = NULL;
            }else{
                c = t->st[--t->sp];
            }
        }
        t->cc = c;
    }
    if(t->cc) return(t->cc->m);
    else{
        AVLFirst(t);
        return NULL;
    }
}
int wr_out_bdl(ROW *iflist[ ], char *bfname,
               FILE *fbptr, char *prog_rev, int slines)
/* This function takes in a pointer to the spreadsheet structure, buffer
module name, and the pointer to a file name and
outputs the bdl for the buffer midmacro. */
{
    static int beh_bool = 0;
    time_t t;
    char * common = "COMMON";
    BUFMM *bm = NULL;
    BUFMM *um = NULL;
    char *tptr;
```

-continued

```
            t = time(NULL);
               fprintf(fbptr,"{BDL BUFGEN Module Created %s",ctime(&t));
               fprintf(fbptr,"     Generated with BUFGEN Program Revision %s\n",prog_rev);
               fprintf(fbptr,"           Using RULES Revision %s\n",rule_rev);
fprintf(fbptr,"==========================================
===\n");
               fprintf(fbptr,"\n");
               fprintf(fbptr," }\n");
               fprintf(fbptr,"MODULE %s%s : ASCENDING;\n",asic_name,bfname);
               fprintf(fbptr," NETWORK %s%s\n",asic_name,bfname);
               fprintf(fbptr,"   (INPUT\n");
               fprintf(fbptr,"\n");
       fprintf(fbptr,"{ Arranged with inputs then outputs in pin order }\n");
               fprintf(fbptr,"{  Input variables for this Module. }\n");
               fprintf(fbptr,"\n");
               bm = get_bufmm_ptr(common);
    if(bm){
               include_list(bm->in_term,fbptr);
    }
               um = get_bufmm_ptr(bfname);
               if(um){
                 include_list(um >in_term,fbptr);
    }
               tptr = AVLFirst(ins);
               while (tptr){
                 fprintf(fbptr,"    %s : BIT;\n",tptr);
                 tptr = AVLNext(ins);
               }
               bdl_terminals(iflist, bfname, fbptr, slines, 'I');
               fprintf(fbptr,"\n");
               if (bidis_bool == 'T'){
                 fprintf(fbptr,"     DUPLEX\n");
                 fprintf(fbptr,"{    Bidirectional variables for this Module.}\n");
                 fprintf(fbptr,"\n");
                 if (bm){
                   include_list(bm->bidi_term,fbptr);
    }
                 if(um){
                   include_list(um->bidi_term,fbptr);
    }
                 bdl_terminals(iflist, bfuame, fbptr, slines, 'B');
                 fprintf(fbptr,"\n");
    }
                 fprintf(fbptr,"     OUTPUT\n");
                 fprintf(fbptr,"{    Output variables for this Module.}\n");
                 fprintf(fbptr,"\n");
                 if (bm){
                   include_list(bm->out_term,fbptr);
    }
                 if(um){
                   include_list(um->out_term,fbptr);
    }
                 tptr = AVLFirst(outs);
                 while (tptr){
                   fprintf(fbptr,"         %s : BIT;\n",tptr);
                   tptr = AVLNext(outs);
                 }
                 bdl_terminals(iflist, bfname, fbptr, slines, 'O');
                 fprintf(fbptr,"\n");
                 fprintf(fbptr,"   );\n");
                 if(!beh_bool){
                     fprintf(fbptr,"\n");
                     fprintf(fbptr," COMP\n");
                     bdl_comps(iflist,bfname, fbptr, slines);
                     fprintf(fbptr,"\n");
  /*                 fprintf(fbptr," NET\n"); */
  /*        bdl_nets(1);   */
                     fprintf(fbptr,"\n");
                     fprintf(fbptr,"BEGIN\n");
                     bdl_connections(fflist,bfname, fbptr,slines);
                     fprintf(fbptr," END %s%s;\n",asic_name,bfname);
                 }else{
                     fprintf(fbptr," BEGIN\n");
                     fprintf(fbptr," END %s%s;\n", asic_name,bfname);
                 }
                 fprintf(fbptr,"END %s%s.\n", asic_name,bfname);
}
void wr_out_addl(ROW *iflist[ ], char *bfname, FILE *fbptr, int slines)
/* This function writes out the add logic element - one per midmacro
```

```
to correct a Tsar bidi problem */
{
int i = 0;
int same_buf = 1;
char *intbuf = "CHQQA";
char *outbuf = "CHQQB";
char *conn_ln;
RULE *rulptr;
BUFFER *inbfptr;
BUFFER *outbfptr;
BUFMM *bfmmptr;
    fprintf(fbptr,"*ADDLOGIC ON\n");
    inbfptr get_bufr_ptr(intbuf);
    outbfptr = get_bufr_ptr(outbuf);
    if(inbfptr==NULL){
        printf("**Error* Cannot find add logic input buffer in rules file");
    }
    if(outbfptr==NULL){
        printf("**Error* Cannot find add logic output buffer in rules file");
    }
                bfmmptr = get_bufmm_ptr(bfname);
    if(bfmmptr==NULL){
        printf("**Error* Cannot buffer mid macro name -- program error");
    }
    for (i=0; i<=slines; i++){
        if (iflist[i]->bfmm){
                same_buf = strcmp(iflist[i]->bfmm,bfname);
        }else{
                same_buf = 1;
        }
        if (same_buf == 0){
            if (iflist[i]->direction == 'I'){
                    rulptr = inbfptr->conn_start;
            }
            if (iflist[i]->direction == 'O'){
                    rulptr = outbfptr->conn_start;
            }
            while (rulptr){
                conn_ln = make_name(i,rulptr->connect_str,iflist, fbptr,bfmmptr);
                fprintf(fbptr,"%s\n",conn_ln);
                rulptr= rulptr->next;
            }
        }
    } /* End loop on slines */
        fprintf(fbptr,"*ADDLOGIC OFF\n");
} /* End wr_out_addl */
void load_rules(FILE *fptr)
/* This function reads the file bufgen.nil and loads the struct that
        defines the buffers and the included bdl arrays. The file bufgen.rul
        is in a spreadsheet comma separated format */
{
/*      FILE *fptr; */
        static char *filename = "c:\\bufgen\\bufgen.rul";
        char *comment = "COM";
        char *buffer = "BUFFER";
        char *compare ="COMP_NAME";
        char *rev = "REV";
        char *connect = "CONNECT";
        char *buffermm = "BUFFER_MM";
        char *in_term = "INPUT_TERM";
        char *out_term = "OUTPUT_TERM";
        char *bidi_term = "BIDI TERM";
        char *term_col = "TERM_COL";
    char *scan_ord_col = "SCAN_ORD_COL";
        char *input_col = "INPUT_COL";
    char *output_col = "OUTPUT_COL";
        char *bit_col = "BIT_COL";
        char *direct_col = "DIRECT_COL";
        char *bufmm_col = "BUFMM_COL";
        char *buf_col = "BUFFER_COL";
        char *ssvar_col = "SSVAR_COL";
        char *pin_col = "PIN_COL";
        char *pad_col = "PAD_COL";
        char *bump_col = "BUMP_COL";
    char *flags col = "FLAGS_COL";
        char *process_col = "PROCESS_COL";
    char *bdl_bidi_attrib = "BDL_BIDI_ATTRIB";
        char *init_scan_chain = "INIT_SCAN_CHAIN";
        char *set_scan_chain = "SET_SCAN_CHAIN";
```

```
            char *wrap = "WRAP";
                char *endb = "END";
        int chain_no = 1;
                int line = 0;
                int buffer_no = 0;
                RULE *prev_ptr;
        RULE *new_ptr;
                CHAIN *prev_cptr;
        CHAIN *new_cptr;
                char legal_keyword = 'F';
                char *keyword;
                char *value;
                BUFMM *lastptr = NULL;
                BUFMM *nextptr = NULL;
                char open_bufmm = 'F';
/*              printf("filename= %s; \n",filename); */
/*              fptr = fopen(filename,"r"); */
/*              printf("%i",fptr); */
                if(fptr == NULL){
                        printf("Error in opening rules file %s: Terminating Program 0\n:",filename);
                        perror(filename);
                        exit(9);
                }
                buffer_no = 0;
                while (fgets(msg, 300, fptr) != NULL) {    /* read a string from the file */
/*              printf("msg1 = %s", msg);   */                              /* debug display */
                        if (strlen(msg) > 299){
                         printf("** Error * The following input string length too long.\n");
                         printf("%s",msg);
                        };
                        line++;
                        trmstr(msg);
                        ff ((msg[0] == '-' && msg[1] == '-')||strlen(msg)==0){
                                keyword = comment;
        }else{
                                keyword = strtok(msg," ");
                                value = keyword + strlen(keyword) +1;
                        legal_keyword = 'F';
        }
                        if (strcmp(keyword,comment)) {  /* if not a comment */
                          if (strchr(keyword,'(') || strchr(keyword,')')){ /* function parse */
                                chain_no = atoi(parse_param(keyword));
                                if (strcmp(keyword init_scan_chain)==0){
                                        legal_keyword = 'T';
/*                                      scan_end_name[chain_no] =Calloc(1,sizeof(*prev_ptr)); */
                                        scan_chain_var[chain_no] =Calloc(1,36);
                                        if (strcmp(value,wrap)==0){
                                                printf("**Error* The wrap feature is not implemented yet\n");
                                        }else{
/*                                              scan_end_name[chain_no]->connect_str = Strdup(value); */
                                                strcpy(scan_chain_var[chain_no],value);
                                        }
                                }else{
                                        printf("**Error* Illegal use of parenthesis in string %s in Rules file\n",
        keyword);
                                }
        }
                          if (strcrnp(keyword,buffer) == 0){
                                        buffer_no++;
                                        if (buffer_no > 70){
                                                printf("Error Buffer Table Overflow. You can only define 70
Buffers.\n");
                                                printf("** This limit will have to be increased in the program to
proceed.\n");
                                                exit(9);
        }
                                        bflist[buffer_no] = calloc(1,sizeof(*bflistfbuffer_no]));
                                        if (bfist[buffer_no] == NULL){
                                                printf("ERROR You Ran out of Memory on line %i of file %s",
                                                line,*filename);
                                                exit(9);
                                        }
                                        bflist[buffer_no]->bufname = Strdup(tstrupper(value));
/*                              legal_keyword = 'T';
                                printf("Buffer name = %s\n",bflist[buffer_no]->bufname) */;
                                        tot_macros = buffer_no;
                                }
                                if (strcmp_keyword,buffermin)==0){
                                        tot_bufmm++;
```

-continued

```
            open_bufmm = 'T';
                nextptr = calloc(1,sizeof(BUFMM));
                if(nextptr == NULL){
                    printf("ERROR You Ran out of Memory on line %i of file %s",
                    line, *filename);
                    exit(9);
                }
                nextptr->bufmmname = Strdup(tstrupper(value));
        nextptr->bidi_bool = 'F';
                legal_keyword = 'T';
                nextptr->next = NULL;
                printf("Buffer Midmacro name = %s\n",nextptr->bufmmname);
                if(lastptr){
                    lastptr->next = nextptr;
                }else{
                    bufmm_start = nextptr;
                }
                lastptr = nextptr;
            }
            if (strcmp(keyword,compname) == 0) {
                bflist[buffer_no]>compname = Strdup(tstrupper(value));
                legal_keyword = 'T';
            }
            if (strcmp(keyword,connect) == 0) {
                new_ptr = calloc(1,sizeof(*prev_ptr));
                if (new_ptr == NULL){
                    printf("ERROR You Ran out of Memory on iine %i of file %s",
                    line,*filename);
                    exit(9);
                }
                if(!bflist[buffer_no]->conn_start){
                    bfist[buffer_no]->conn_start = new_ptr;
                }else{
                    prev_ptr->next = new_ptr;
} new_ptr->connect_str = Strdup(value);
                new_ptr->next = NULL;
prev_ptr = new_ptr;
                legal_keyword = 'T';
            }
            if (strcmp(keyword,set_scan_chain) == 0) {
                new_cptr = calloc(1,sizeof(*prev_cptr));
                if (new_cptr == NULL){
                    printf("ERROR You Ran out of Memory on line %i of file %s",
                    line,*filename);
                    exit(9);
                }
                if(!bflist[buffer_no]->chain_start){
                    bfist[buffer_no]->chain_start = new_cptr;
                }else{
                    prev_cptr->next = new_cptr;
} new_cptr->chain_no = atoi(value);
                new_cptr->next = NULL;
prev_cptr = new_cptr;
                legal_keyword = 'T';
            }
        if (strcmp(keyword,in_term)== 0) {
            new_ptr = calloc(1,sizeof(RULE));
            if (new_ptr == NULL){
                printf("ERROR You Ran out of Memory on line %i of file %s",
                line,*filename);
                exit(9);
            }
            if(=nextptr->in_term) {
                nextptr->in_term = new_ptr;
            }else{
                prevptr->next = new_ptr;
} new_ptr->connect_str = Strdup(value);
            new_ptr->next = NULL;
            prev_ptr = new_ptr;
            legal_keyword = 'T';
        }
        if (strcmp(keyword,out_term)== 0) {
            new_ptr = calloc(1,sizeof(RULE));
            if (new_ptr == NULL){
                printf("***ERROR** You Ran out of Memory on line %i of file %s",
                line,*filename);
```

-continued

```
                    exit(9);
                }
            if(<=nextptr->out_term){
                    nextptr->out_term = new_ptr;
                }else{
                    prev_ptr->next = newptr;
        }
                new_ptr->connect_str = Strdup(value);
                new_ptr->next = NULL;
                prev_ptr = new_ptr;
                legal_keyword = 'T';
            }
        if (strcmp(keyword,bidi_term) == 0) {
                new_ptr = calloc(1,sizeof(RULE));
                if(new_ptr == NULL){
                    printf("** ERROR** You Ran out of Memory on line %i of file %s",
                    line,*filename);
                        exit(9);
                }
                if(<=nextptr->bidi_term){
                    nextptr->bidi_term = new_ptr;
                }else{
                    prev_ptr->next = new_ptr;
        }
                new_ptr->connect_str = Strdup(value);
                new_ptr->next = NULL;
                prev_ptr = new_ptr;
                legal_keyword = 'T';
            }
            if (strcmp(keyword,rev) == 0) {
                rule_rev = Strdup(value);
                legal_keyword = 'T';
            }
            if (strcmp(keyword,endb)== 0) {
                legal_keyword = 'T';
                if (bflist[buffer_no]>compname==NULL && open_bufmm!= 'T'){
                    printf("Warning Buffer in Rules file %s is missing a Component Name Rule\n",
                    bflist[buffer_no]>bufname);
                }
                open_bufmm = 'F';
            }
            if (strcmp(keyword,bdl_bidi_attrib)== 0) {
                strcpy(bidi_attribute,value);
                legal_keyword = 'T';
            }
            if (strcmp(keyword,term_col)== 0) {
                term_d = atoi(value);
                if (term_cl <1 || term_cl > 64){
                printf("**Error ** Illegal integer range %s for %s\n",
                value,term_col);
            }
                legal_keyword = 'T';
            }
            if (strcmp(keyword,scan_ord_col) == 0) {
                scan_ord_d = atoi(value);
                if (scan_ord_cl <1 || scan_ord_cl > 64){
                printf("**Error ** Illegal integer range %s for %s\n",
                value,scan_ord_col);
            }
                legal_keyword = 'T';
            }
            if (strcmp(keyword,input_col) == 0) {
                input_cl = atoi(value);
                if (input_cl <1 || input_cl > 64){
                printf("**Error ** Illegal integer range %s for %s\n",
                value,input_col);
            }
                legal_keyword = 'T';
            }
            if (strcmp(keyword,output_col) == 0) {
                output_cl = atoi(value);
                if (output_cl <1 || output_cl > 64){
                printf("**Error ** Illegal integer range %s for %s\n",
                value,output_col);
            }
                legal_keyword = 'T';
            }
            if (strcmp(keyword,bit_col) == 0) {
```

```
                bit_cl = atoi(value);
                if (bit_cl <1 || bit_cl > 64){
                    printf("**Error ** Illegal integer range %s for %s\n",
                    value,bit_col);
    }
                legal_keyword = 'T';
            }
        if (strcmp(keyword,bufmm_col)== 0) {
                bufmm_cl = atoi(value);
                if(bufmm_cl<1 || bufmm_cl > 64){
                    printf("**Error ** Illegal integer range %s for %s\n",
                    value,bufmm_col);
    }
                legal_keyword = 'T';
            }
        if (strcmp(keyword,direct_col) == 0) {
                direct_cl = atoi(value);
                if (direct_cl <1 || direct_cl > 64){
                    printf("**Error ** Illegal integer range %s for %s\n",
                    value,direct_col);
    }
                legal_keyword = 'T';
            }
        if (strcmp(keyword buf_col) = 0) {
                if (atoi(value)<1 || atoi(value) > 64){
                    printf("**Error ** Illegal integer range %s for %s\n",
                    value,buf_col);
                }
                bufvars++;
                bufvar_cl[bufvars] = atoi(value);
                legal_keyword = 'T';
            }
        if (strcmp(keyword,ssvar_col)== 0) {
                if ( atoi(value)<1 || atoi(value) > 64){
                    printf("**Error ** Illegal integer range %s for %s\n",
                    value,ssvar_col);
    }
                ssvars++;
                ssvar_cl[ssvars] = atoi(value);
                legal_keyword = 'T';
            }
        if (strcmp(keyword,pin_col) == 0) {
                    pin_cl = atoi(value);
                    if ( pin_cl<1 || pin_cl > 64){
                        printf("**Error ** Illegal integer range %s for %s\n",
                        value,pin_col);
                }
                    legal_keyword = 'T';
                }
            if (strcmp(keyword,pad_col) == 0) {
                    pad_cl = atoi(value);
                    pad_cl <1 || pad_cl > 64){
                        printf("**Error ** Illegal integer range %s for %s\n",
                        value,pad_col);
                }
                    legal_keyword = 'T';
                }
            if (strcmp(keyword,bump_col) == 0) {
                    bump_cl = aloi(vatue);
                    if (bump_cl <1 || bump_cl > 64){
                        printf("**Error ** Illegal integer range %s for %s\n",
                        value,bump_col);
                }
                    legal_keyword = 'T';
                }
            if (strcmp(keyword,flags_col)== 0) {
                    flags_cl = atoi(value);
                    if (flags_cl <1 || flags_cl > 64){
                        printf("**Error ** Illegal integer range %s for %s\n",
                        value,flags_col);
                }
                    legal_keyword = 'T';
                }
            if (strcmp(keyword,process_col) == 0) {
                    process_cl = atoi(value);
                    if (process_cl <1 || process_cl > 64){
                        printf("**Error ** Illegal integer range %s for %s\n",
                        value,process_col);
                }
```

-continued

```
                        legal_keyword = 'T';
                }
                if (legal_keyword != 'T'){
                        printf("** Error ** Illegal keyword in rules file\n");
                printf("%s %s\n", keyword, value);
                }
                    } /* End if not comment */
         } /* End while reading file */
/*   fclose(fptr); */
        bmm_lastptr = lastptr;
        printf("There are %i spreadsheet variables defined in the rules file\n",
        ssvars+1);
        printf("There are %i buffer columns defined in the rules file\n",
        bufvars+1);
        printf("There are %i Buffer types defined in the rules file. The max number is 70.\n",
                tot_macros);
                printf("There are %i Buffer Midmacro Types defined in the rules file.\n",
                tot_bufmm);
                printf("\n");
}            /* End load_rules */
void bdl_terminals(ROW *iflist[ ], char *bfname, FILE *fbptr,
int slines, char term_dir)
/* This function takes in a pointer to the spreadsheet structure, buffer
module name, and the pointer to a file name, and
outputs the bdl interface for the buffer midmacro. */
{
int i = 0;
static char bdl_att[50] = " ";
int same_buf = 1;
char *bit_st;
                if (term_dir == 'I' || term_dir == 'O'){
                        strcpy(bdl_att," ");
                }else{
                        strcpy(bdi_att,bidi_attribute);
                }
                if (term_dir == 'I' || term_dir == 'O'){
                chain dir = term_dir;
                        chain_if(get_bufmm_ptr(bfname),iflist, fbptr, bdl_att, term_dir);
        }
                for (i=0; i<=slines; i++){
                        same_buf = strcmp(iflist[i]->bfmm,bfname);
                        if (iflist[i]->hdrf == 'T'){
                          bit_st = form_bit(i,bfname,iflist);
                        }else{
                          bit_st = NULL;
                        }
                        if (iflist[i]->direction == term_dir){
/*                      if (term_dir == 'B' && iflist[i]->direction!='\0'){   /* Temporary until compiler
fixed */
                                if (same_buf == 0 && *iflistm->bit_no == '\0'){
                                        fprintf(fbptr,"    %s ; BIT %s ;\n",iflist[i]->tname,
                                        bdl_att);
                                } else {
                                if (bit_st){
                                        fprintf(fbptr,"    %s : VECTOR[%s]%s;\n",
                                        iflist[i]->tname,bit_st,bdl_att)
                                }
                                }
                        }
                        if ((iflist[i]->direction == 'O' || iflist[i]->direction=='B') &&
                          term_dir == 'I'){
                        if (same_buf == 0 && *iflist[i]->bit_no == '\0' &&
                          *iflist[i]->output!= '\0'){
                                fprintf(fbptr,"    %s : BIT ;\n",iflist[i]->output);
                        } else {
                                if (bit_st){
                                        fprintf(fbptr,"    %s : VECTOR[%s];\n",
                                        iflist[i]->output,bit_st)
                                }
                        }
                        }
                if ((iflist[i]->direction == 'I' || iflist[i]->direction=='B') &&
                  term_dir == 'O'){
                   if (same_buf == 0 && *iflist[i]->bit_no == '\0' &&
                     *iflist[i]->input=='\0'){
                        fprintf(fbptr,"    %s : BIT ;\n",iflist[i]->input);
                   } else {
                        if (bit_st){
                                fprintf(fbptr,"    %s : VECTOR[%s];\n",
```

-continued

```
                    iflist[i]->input,bit_st);
                }
            }
        }
    } /* End for loop */
} /* End bdl terminals */
void bdl_comps(ROW *iflist[ ], char *bfname, FILE *fbptr,
mt slines)
/* This function takes in a pointer to the spreadsheet structure, buffer
module name, and the pointer to a file name, and
outputs the bdl component section for the buffer midmacro. */
{
int i = 0;
char *inst_nam;
BUFLL *bufptr;
BUFMM *bufmm_ptr;
        bufmm_ptr = get_bufmm_ptr(bfname);
        for (i=0; i<=slines; i++){
            if (iflist[i]->bfmm && iflist[i]->buf_start){
                if (strcmp(iflist[i]->bfmm,bfname) == 0){
                    bufptr = iflist[i]->buf_start;
                    while (bufptr){
                        if(bufptr->buf && bufptr->buf->compname &&
                            bufptr->buf->bufname){
/*      debug    printf("Compname= %s Buffername= %s\n",bufptr->buf->compname,
        bufptr->buf->bufname);
printf("breakpoint hit return\n"); */
                                    inst_nam = make_name( i, bufptr->buf->compname,
                                iflist,fbptr, bufmm_ptr);
                                        fprintf(fbptr,"    %s : %s ;\n",inst_nam,
                                            tstripver(bufptr->buf->bufname));
                                }
                                bufptr = bufptr->next;
                        }
                    }
                }
            } /* End for loop */
} /* End bdl_comps */
void *update_chain( int lnn, BUFLL *buflist, ROW *sprdsht[ ])
/* This function takes in the array pointer to the spreadsheet struct
and the pointer to the buffer macro linked list being processed and
updates the scan chain variable array for any chain that should be updated
when instantinting the buffers. Note the rules for each buffer contain
the linked list of the chains that are updated by the buffer. */
{
BUFLL *bufptr;
CHAIN *chainptr;
    bufptr = bufist;
    while (bufptr){
       if(bufptr->buf && bufptr->buf->chain_start){
          chainptr = bufptr->buf->chain_start;
                while (chainptr){
                    strcpy(scan_chain_var[chainptr->chain_no],sprdsht[lnn]->pad);
                        chainptr = chainptr->next;
        }
            }
            bufptr = bufptr->next;
    }
}
char *make_name( int lnn, char *name, ROW *sprdsht[ ],FILE *fbptr,
            BUFMM *bufmmptr)
/* This function takes in the array pointer to the spreadsheet stuct
and the pointer to a character string and generates a name string */
{
            char* pad = "PAD";
            char* pin = "PIN";
            char* term = "TERM";
            char* input = "INPUT";
            char* output = "OUTPUT";
    char* network ="NETWORK";
            char* networkt = "NETWORKT";
            char* include ="INCLUDE";
            char* next = "NEXT";
            char* spare = "SPARE_";
            char* ssvar = "SSVAR";
    char* chain = "CHAIN",
        char* bdlerror = "{ **** Missing Spreadsheet Variable *** }";
        char* spare_conn = "{ ***** Omitted Connection to Spare Site ***}";
        char legal_keyword = 'F';
```

```
        char missing_val = 'F';
            BUFFER *include_ptr;
            char* num = "#";
            static char init_name[120];
            static char final_name[150] = " ";
        static char comment_name[150] = " ";
            char itoa[20] = " ";
            char *tstr;
            char nstr[100];
            char *value;
            char *shfchar;
            int ln;
            int j = 0;
        int llentry = 0;
            RULE *nextptr;
        CHAIN *nextcptr;
            ln= lnn;
            strcpy(init_name,name);
            strupper(init_name);
            trmstr(init_name);
        strcpy(final_name" ");
            tstr = strtok(init_name,"+");
            missing_val = 'F';
            chain_num = 0;
            while (tstr && missing_val!='T'){
                legal_keyword = 'F';
                strcpy(nstr,tstr);
                trmstr(nstr);
                /* All functions are parsed in this section */
                if (fn_chk(nstr)==0){ /* function parse */
                value = parse_param(nstr);
                if (strcmp(nstr,include)==0){
                    legal_keyword = 'T';
                    include_ptr = get_bufr_ptr(value);
            if (include_ptr) {
                    do_conn_rules(include_ptr->conn_starfbptr,ln,sprdsht,bufmmptr);
                if (strlen(value)< 80)
                        sprintf(final_name,"{ End included code from %s }",
                        value);
                    else
                        sprintf(final_name,"{ End included code }");
                }else{
                    printf("** Error ** Undefined Buffer %s for included connections\n",
                    value);
                missing_val = 'T';
                }
        return(final_name);
                }
                if (strcmp(nstr,next)==0){
                    legal_keyword = 'T';
                    ln++;
                    if(ln>=ssins) ln = 0;
                    strcpy(nstr,value);
                }
                if (strcmp(nstr,ssvar)==0){
                    legal_keyword = 'T';
                    llentry = atoi(value)-1;
                    if(llentry>ssvars || llentry<=-1){
                        printf("Error Spreadsheet variable %s(%s) requested is out of
range\n",
                        nstr,value);
            missing_val = 'T';
                    }
        nextptr = sprdsht[ln]->ssvar_start;
                    for(j=0;j<llentry;j++){
                        nextptr = nextptr->next;
                    }
                    if (*nextptr->connect_str!='\0'){
                        strcat(final_name,nextptr >connect_str);
                    }else if (chain_if_num == 0){
                        printf("Error Spreadsheet column %i is not defined for row
%i\n",
                        ssvar_cl[atoi(value)-1],sprdsht[ln]->sstn_no);
                        missing_val = 'T';
                    }
                }
        /* The update of the scan variable needs to be done in its own function */
                if (strcmp(nstr,chain)==0){
                    legal_keyword = 'T';
```

-continued

```
            llentry = atoi(value);
/* Temporarily comments out chain connections */
/*      missing_val = 'C'; */
            chain_num = llentry;
/* Remove previous statement to enter chains */
            if (llentry>chainvars || llentry<=-1){
                printf("Error Scan Chain variable %s(%s) requested is out of
range\n",
                    nstr,value);
          missing_val = 'T';
            }
            strcat(final_name,scan_chain_var[llentry]);
        }
        if (legal_keyword != 'T'){
            sprintf(itoa,"%s(%s)***",nstr,value);
            strcat(final_name,itoa);
/*      printf("You shouldnt be here\n"); */
            legal_keyword = 'T';
        }
    }
    if (strcmp(nstr,pad)==0){
        if (*sprdsht[ln]->pad != '\0'){
    strcat(final_name,sprdsht[ln]->pad);
        }else{
            printf("Error Missing Spreadsheet variable %s line %i for
BDL\n",
                nstr,sprdsht[ln]->ssln_no);
            missing_val = 'T';
        }
        legal_keyword = 'T';
    }
    if (strcmp(nstr,pin)==0){
        if (*sprdsht[ln]->pin != '\0'){
    strcat(final_name,sprdsht[ln]->pin);
        }else{
            printf("Error Missing Spreadsheet variable %s line %i for
BDL\n",
                nstr,sprdsht[ln]->ssln_no);
            missing_val = 'T';
        }
        legal_keyword = 'T';
    }
    if (strcmp(nstr,num) == 0){
  sprintf(itoa,"%i",name_no);
        strcat(final_name,itoa);
        legal_keyword = 'T';
        name_no++;
    }
    if (strcmp(nstr,term)==0){
        if (*sprdsht[ln]->tname != '\0'){
            strcat(final_name, sprdsht[ln]->tname);
            if (*sprdsht[ln]->bit_no != '\0'){
                sprintf(itoa,"[%s]",sprdsht[ln]->bit_no);
                strcat(final_name,itoa);
            }
        }else{
            printf("Error Missing Spreadsheet variab
            e %s line %i for
BDL\n",
                nstr,sprdsht[ln]->ssln_no);
            missing_val = 'T';
        }
        legal_keyword = 'T';
    }
    if (strcmp(nstr,input)==0){
        if (*sprdsht[ln]->input != '\0'){
            strcat(final_name, sprdsht[ln]->input);
            if (*sprdsht[ln]->bit_no != '\0'){
                sprintf(itoa,"[%s]",sprdsht[ln]->bit_no);
                strcat(final_name,itoa);
            }
        }else{
        if (strncmp(sprdsht[ln]->tname,spare,6)!=0){
            printf("Error Missiug Spreadsheet variable %s line %i for
BDL\n",
                nstr,sprdsht[ln]->ssin_no);
                missing_val = 'T';
            }else{
                missing_val = 'S';
```

```
                }
                    }
                    legal_keyword = 'T';
                }
            if (strctnp(nstr,output)==0){
                if (*sprdsht[ln]->output != '\0'){
                    strcat(final_name, sprdsht[ln]->output);
                    if (*sprdsht[ln]->bit_no != '\0'){
                        sprintf(itoa,"[%s]",sprdsht[ln]->bit_no);
                        strcat(final_name,itoa);
                    }
                }else{
                    if (strncmp(sprdsht[ln]->tname,spare,6)!=0){
                        printf("Error Missing Spreadsheet variable %s line %i for
BDL\n",
                            nstr,sprdsht[ln]->ssln_no);
                        missing_val = 'T';
                    }else{
                        missing_val = 'S';
                    }
                }
                legal_keyword = 'T';
            }
            if (strcmp(nstr,networkt)==0){
                if (*sprdsht[ln]->tname != '\0'){
                    strcat(final_name, tstrsufx(sprdsht[ln]->tname,'T'));
                    if (*sprdsht[ln]->bit_no != '\0'){
                        sprintf(itoa,"[%s]",sprdsht[ln]->bit_no);
                        strcat(final_name,itoa);
                    }
                }else{
                    prntf("Error Missing Spreadsheet variable %s line %i for
BDL\n",
                        nstr,sprdsht[ln]->ssln_no);
                    missing_val = 'T';
                }
                legal_keyword = 'T';
            }
            if (strcmp(nstr,network) = 0){
                if (*sprdsht[ln]->tname != '\0'){
                    strcat(final_name, sprdsht[ln]->tname);
                    if (*sprdsht[ln]->bit_no != '\0'){
                        sprintf(itoa,"[%s]",sprdsht[ln]->bit_no);
                        strcat(final_name,itoa);
                    }
                    }else{
                        printf("Error Missing Spreadsheet variable %s line %i for
BDL\n",
                            nstr,sprdsht[ln]->ssln_no);
                        missing_val = 'T';
                    }
                    legal_keyword = 'T';
                }
                if (legal_keyword != 'T'){
                  while (strchr(nstr,'\"')){ /* Remove quotes */
                        shfchar = strchr(nstr,'\"');
                    while (*shfchar!='\0'){
                        *shfchar = *(shfchar+1);
                            shfchar = shfchar + 1;
                    }
                }
                    strcat(final_name,nstr);
                }
/*          printf("%s %i\n", final_name, nstr); */
                tstr = strtok(NULL,"+");
            } /* End While tokenizing string */
            if(missing_val == 'T'){
                strcpy(final_name," ");
                return(bdlerror);
            }else{
                if (missing_val == 'S'){
                  strcpy(final_name," ");
                  return(spare_conn);
                }else{
                  if(missing_val == 'C'){
                      strcpy(comment_name,"{");
                      strcat(comment_name final_name);
                      strcat(comment name,"}");
                      strcpy(final_name,comment_name);
```

-continued

```
                }else
                        return(final_name);
                }
        }
}       /* End make_name function */
char *tree_names( int lnn, char *name, ROW *sprdsht[ ])
/* This function takes in the array pointer to the spreadsheet stuct
and the pointer to a character string and looks for SSVAR uses so
terminals can be declared */
{
                char* include ="INCLUDE";
                char* ssvar = "SSVAR";
                char missing_val = 'F';
                BUFFER *include_ptr;
                static char init_name[120];
                static char final_name[150] = " ";
                char *tstr;
        char nslr[100];
        char *value;
        char *coloc;
        char *conn_ln;
        int ln;
        int j = 0;
    int llentry = 0;
    RULE *nextptr;
        RULE *rulptr;
        ln = lnn;
        strcpy(init_name,name);
        strupper(init_name);
        trmstr(init_name);
        strcpy(final_name," ");
        coloc = strchr(init_name,':');
        tstr = strtok(init_name,"+");
        missing_val = 'F';
        while (tstr && missing_val!='F'){
            strcpy(nstr,tstr);
            trmstr(nstr);
            /* All functions are parsed in this section */
            if (strchr(nstr,'(') || strchr(nstr,')')){ /* function parse */
            value = parse_param(nstr);
            if (strcmp(nstr,include) ==0){
                include_ptr = get_bufr_ptr(value);
        if (include_ptr){
                        rulptr = include_ptr->conn_start;
                        while (rulptr){
                                conn_ln = tree_names(lnn,rulptr->connect_str,sprdsht);
                                rulptr = rulptr->next;
                        }
                }else{
                        printf("Error Undefined Buffer %s for included connections\n",
                        value);
            missing val = 'T';
                }
        return(final_name);
                }
                if (strcmp(nstr,ssvar)==0){
                        llentry = atoi(value)-1;
                        if (llentry>ssvars || llentry<=-1){
                                printf("Error Spreadsheet variable %s(%s) requested is out of
range\n",
                                nstr,value);
            missing_val = 'T';
                }
                nextptr = sprdsht[ln]->ssvar_start;
                for(j=0;<llentry;j++){
                        nextptr = nextptr->next;
                }
                        if (*nextptr->connect str!='\0'&&
                                rsvd_wd(nextptr->connect str)!='T'){
                                        if(tstr >= coloc){
                                                if(!AVLFind(ins,nextptr->connect str)){
                                                        AVLInsert(ins,nextptr->connect_str);
                                                }
                                        }else{
                                                if(!AVLFind(outs,nextptr->connect_str)){
                                                        AVLInsert(outs,nextptr->connect_str);
                                                }
                                        }
                        }
                        }
```

-continued

```
/* This assumes that a reserved word can be used as a connection */
            }
          }
          tstr = strtok(NULL,"+");
      } /* End While tokenizing string */
} /* End tree_names function */
char rsvd_wd(char *name)
/* This function checks a name against a reserved word list and returns
         a character T for true and F for false */
{
char *high = "HIGH";
char *low = "LOW";
char *rsvd_wds[2];
int rsvd_wd_tot = 2;
int i = 0;
char bool = 'F';
rsvd_wds[0] = high;
rsvd_wds[1] = low;
      for (i=0;i<rsvd_wd_tot;i++){
             if(strcmp(name,rsvd_wds[i])==0){
                 bool = 'T';
                 return(bool);
             }
      }
      bool = 'F';
      return(bool);
}
char *parse_param(char *instr)
/* This function parses out a parameter out of function */
{
char *lp;
char *rp;
char *substr;
      rp = instr + strlen(instr)-1;
      lp = strchr(instr,'(');
      if(!lp){
             printf("Error Missing left parenthesis in function string %s\n",
                 *instr);
      }else{
             *lp = '\0';
             trmstr(instr);
      }
      while (*rp != ')' && rp>lp && *rp!='\0') rp--;
      if(rp == lp || *rp=='\0'){
             printf("Error Missing right parenthesis in function string %s\n",
                 *instr);
      }
       *rp = '\0';
      substr = lp + 1;
 trmstr(substr);
return (substr);
}
int fn_chk(char *instr)
/* This function checks for parentheses that are not back slashed
and if they are the back slashes are removed. 0 returned says it is
a fn and 1 says no */
{
char *lp;
char *rp;
char *shfchar;
int ret_fn=1;
      lp = strchr(instr,'(');
      rp = strchr(instr,')');
      if(lp || rp){ /* function parse */
         if (strchr(instr,'\\')){
    ret_fn = 0;
             if(lp){
                shfchar = lp-1;
      if (*shfchar=='\\'){
             while (*shfchar!='\0'){ /* shift left to get rid of slash */
                *shfchar = *(shfchar+1);
    shfchar = shfchar+1;
             }
    ret_fn = 1;
             }
      }
             if(rp){
                shfchar = rp-1;
      if (*shfchar=='\\'){
```

-continued

```
                        while (*shfchar!='\0'){
                        *shfchar = *(shfchar+1);
                        shfchar = shfchar + 1;
        }
                                ret_fn = 1;
                                }
                        }
                return(ret_fn);
                        }else{
                                return(0);
                        }
                }else{
                        return (1);
                }
        }
}
void bdl_connections(ROW *iflist[ ], char *bfname, FILE *fbptr, int slines)
/* This function generates the bdl connections for the buffer mid macro
{
int i = 0;
char *conn_ln;
RULE *rulptr;
BUFLL *bufptr;
BUFMM *bfmmptr;
        bfmmptr = get_bufmm_ptr(bfname);
                for (i=0; i<=slines; i++){
                        if (iflist[i]->bfmm && iflist[i]->buf_start){
                                if (strcmp(iflist[i]->bfmm,bfname) == 0){
                                bufptr = iflist[i]->buf_start;
                                while (bufptr){
                                        if(bufptr->buf && bufptr->buf->compname &&
                                        bufptr->buf->bufname){ /* Component Name exists */
                                                fprintf(fbptr,"{ Connections for %s type %s }\n",
                                                        make_name(i,bufptr->buf->compname,iflist,fbptr,
                                                        bfmmptr), bufptr->buf->bufname);
                                                rulptr = bufptr->buf->conn_start;
                                                do_conn_rules(rulptr, fbptr, i,iflist, bfmmptr);
                }
                                        if(bufptr->buf && bufptr->buf->compname ==NULL &&
                                        bufptr->buf->bufname){
                                                fprintf(fbptr,"{ Connections for type %s }\n",
                                                        bufptr->buf->bufname);
                                                rulptr = bufptr->buf->conn_start;
                                                do_conn_rules(rulptr, fbptr, i,iflist, bfmmptr);
                }
                                        bufptr = bufptr->next;
                                }
                                /* Update chain variables */
                        update_chain( i, iflist[i]->buf_start, iflist);
                                }
                        }
                }       /* End for loop */
        chain_dfr = 'C';
                chain_if(bfmmptr,iflist, fbptr," ", chain_dir);
} /* End bdl_connections */
        void bdl_conn_terms(ROW *iflist[ ], char *bfname, int slines)
        /* This function generates the bdl terminals for ssvar columns of the
        spreadsheet */
        {
        inti = 0;
        char *conn_ln;
        RULE *rulptr;
        BUFLL *bufptr;
                for (i=0; i<=slines; i++){
                        if (iflist[i]->bfmm && iflist[i]->buf_start){
                                if (strcmp(iflist[i]->bfmm,bfname) == 0){
                                bufptr = iflist[i]->buf_start;
                                while (bufptr){
                                        if(bufptr->buf && bufptr->buf->bufname){
                                                rulptr = bufptr->buf->conn_start;
                                                while (rulptr){
                                                        conn_ln = tree_names(i,rulptr->connect_str,iflist);
                                                        rulptr = rulptr->next;
                                                }
                                        }
                                        bufptr = bufptr->next;
                                }
                                }
                        }
                }       /* End for loop */
```

-continued

```
} /* End bdl_conn_terms */
void do_conn_rules(RULE *rptr, FILE *fbptr, int ssrow,ROW *iflist[ ],
        BUFMM *bfrmm)
/* This function runs through a link list of rules and generates
the bdl connections for the buffer mid macro */
{
char *sem = ";";
char *blank = " ";
char *eoln = ";";
char *conn_ln;
char *per_loc;
RULE *rulptr;
int n = 0;
int i = 0;
    rulptr = rptr;
        while (rulptr){
            conn_ln = make_name(ssrow,rulptr->connect_str,iflist, fbptr,bfrmm);
            if (conn_ln){
                n = 1;
                while (conn_ln[strlen(conn_ln)-n] == ' ')n++;
                if (conn_ln[strlen(conn_ln)-n]==';' ||
                  conn_ln[strlen(conn_ln)-n]=='}'){
                        eoln = blank;
                }else{
                        eoin = sem;
                }
        if(chain_ifnum == 0 && chain_num == 0){
                    fprintf(fbptr,"%s%s\n",conn_ln,eoin);
                }else if(chain_if_num == 0){
                    for (i=1; i<=chainvars; i++){
                        if (ssrow = bfrmm->chain_begin[i]&& chain_num == i){
            /* This is an input chain connection */
                            per_loc = strrchr(conn_ln,'.');
                            if (per_loc)
                            *per_loc = '_';
                        }
                    }
                    fprintf(fbptr,"%s%s\n",conn_ln,eoln);
                }else{
                    make_chain_term(conn_ln,ssrow,fbptr," ",chain_dir);
                }
                rulptr = rulptr->next;
    }
  }
 }
}
void include_list(RULE *rptr, FILE *fbptr)
/* This function runs through a link list of rules and includes
the bdl connections for the buffer mid macro */
{
char * sem = ";";
char *blank = " ";
char *eoln = ";";
char *conn_ln;
RULE *rulptr;
int n = 0;
    rulptr = rptr;
        while (rulptr){
            conn_ln = rulptr->connect_str;
            if (conn_ln){
                n=1;
                while (conn_ln[strlen(conn_ln)-n] == ' ')n++;
                    if (conn_ln[strlen(conn_ln)-n] ==';'||
                      conn_ln[strlen(conn_ln)-n] = '}'){
                        eoln = blank;
                    }else{
                        eoln = sem;
                    }
                    fprintf(fbptr,"%s%s\n",conn_ln,eoln);
                    rulptr = rulptr->next;
            }
        }
}
char *form_bit(int i,char *bfname, ROW *iflist[ ])
/* This fuuction form the linked list of vector bits into Acads ridiculous
        vector with hole notation. It looks for all bits in a vector linked
        list that are in the current buffer */
{
int j = 0;
int prev_bit = 0;
```

-continued

```
static char bit_str[50] = " ";
char *vrng = "..";
char *comma = ",";
char rng = 'T';
char not_cont = 'F';
char only_bit = 'F';
char only_bit = 'T';
            only_bit = 'T';
    not_cont = 'F';    /* Not Contained in buffer */
            j = i;
            bit_str[0] = '\0';
            /* find first bit in the buffer in a list of vector bits */
            while ((strcmp(iflist[j]->bfmm,bfname) != 0) && (not_cont!=T)){
              if (iflist[j]->nextbit >= 0){
                    j = iflist[j]->nextbit;
              }else{
                    not_cont = 'T';
              }
            }
            if (not_cont == T){ /* no bits in this buffer */
              return (NULL);
    }
            strcpy(bit_str,list[j]->bit_no);
    prev_bit = j;
            rng = 'F';
        only_bit = 'T';
            while (iflist[j]->nextbit >= 0 ){
              if (strcmp(iflist[iflist[j]->nextbit]->bfmm,bfname) == 0){
        only_bit = 'F';
              if (atoi(iflist[iflist[j]->nextbit]->bit_no) -
                    atoi(iflist[prev_bit]->bit_no) == 1){
                    rng = 'T';
                    j = iflist[j]->nextbit;
              prev_bit = j;
                }else{
                    if(rng == 'T'){
                        strcat(bit_str,vrng);
                        strcat(bit_str,iflist[prev_bit]->bit_no);
                        /*          was j */
    }
                j = iflist[j]->nextbit;
                prev_bit = j;
                strcat(bit_str,comma);
                strcat(bit_str,iflist[j]->bit_no);
                rng = 'F';
    }
              } else {
                j = iflist[j]->nextbit;
    }
            }
            if (rng == 'T' || only_bit == 'T'){
              strcat(bit_str,vrng);
              strcat(bit_str,iflist[prev_bit]->bit no);
            }
    return (bit_str);
}
void find_chain_ends(ROW *iflist[ ], int slines)
/* This function loops through the spreadsheet list and updates the start
and end points of all chains for each midmacro into the bufmm struct. */
{
int i = 0;
int j = 0;
char chain_used[11];
char *bfname = "XXXXXX";
intsame_buf = 1;
char *bit_st;
BUFLL *bufptr;
CHAIN *chainptr;
BUFMM *bufmmptr;
            /* Loop through buffers and loop through buffer chains and set
            chain_begin and chain_end integer pointers */
        for (i=0; i<=slines; i++){
          if (iflist[i]->bfinm && ifllt[i]->buf_start){
            if (strcmp(iflist[i]->bfmm,bfname) != 0){
            /* if new buffer_mm get buffmm pointer and initialize
            chain_used array */
/*          if(i>0){
        for (j=1;j<= chainvars;j++){
                printf("Buffer %s :Chain %i Start %i - End %i %c\n",
```

-continued

```
                    bfname, j, bufiimiptr->chain_begin[j],bufmmptr->chain_end[j],
                    chain_used[j]);
                }
            } */
            strcpy(bfname,iflist[i]->bfmm);
            bufmmptr = get_bufmm_ptr(bfname);
                for (j=1;j<= chainvars;j++){
                    bufmmptr->chain_begin[j] = -1;
                    bufmmptr->chain_end[j] = -1;
                }
            for (j=1; j<= 10; j++){
              chain_used[j] = 'F';
            }
            }
            bufptr = iflist[i]->buf_start;
                while (bufptr){
                    if(bufptr->buf && bufptr->buf->chain_start){
                chainptr = bufptr->buf->chain_start;
                    while (chainptr){
                      if (chain_used[chainptr->chain_no] == 'T'){
                         bufmmptr->chain_end[chainptr->chain_no] = i;
                      }else{
                            bufmmptr->chain_begin[chainptr->chain_no] = i;
                            chain_used[chainptr->chain_no] = 'T';
                      }
                chainptr=chainptr->next;
                    }
                    }
                    bufptr = bufptr->next;
                }
        }
        }    /* End for loop */
/*            for (j=1;j<= 5;j++){
                    printf("Buffer %s :Chain %i Start %i - End %i %c\n",
                    bfname, j, bufimnptr->chain_begin[j],bufmmptr->chain_end[j],
                    chain_used[j]);
                }    */
} /* find_chain_ends */
void init_chain_vars(BUFMM *bfrmm, ROW *iflist[ ])
/* This function initializes the scan_chain_var array for the first
buffer by calling make_name for each row in the chain->end.*/
{
/* Initialize scan_chain_var array by calling make_name for chain_end
row for each chain of previous buffer. */
int i = 0;
int row = 0;
BUFLL *bufptr;
        for (i=1; i<=chainvars; i++){
                row = b#na->chain_end[i];
    if(row >= 0){
                if (iflist[row]->bfmm && iflist[row]->buf_start){
                    /* Update chain variables */
                    update_chain( row, iflist[row]->buf_start, iflist);
        }
            }
        }    /* End for loop */
} /* init_chain_vars
void chain_if(BUFMM *bfrmm, ROW *iflist[ ], FILE *fbptr,char *t_attr,
                        char dir)
/* This function assumes an initialized scan_chain_var array then calls
make_name for each row in the chain->end list to generate terminal names
*/
{
int i = 0;
int row = 0;
BUFLL *bufptr;
RULE *rulptr;
char *conn_ln;
char *term_name;
char *per_loc;
char *tscan_chain_var[10]; /* Temporary Scan chain variable pointer list */
/* Temporarily save chain_var array so end of chain can be done.
Note this ouput part only works if only one chain statement per
rule is used. */
        for (i=1; i<=chainvars; i++){
                tscan_chain_var[i]= Strdup(scan_chain_var[i]);
        }
        fprintf(fbptr,"{******* Chained Terminals ****** }\n");
        for (i=1; i<=chainvars; i++){
```

-continued

```
            if(dir == 'O' || dir == 'C'){
              row = bfrmm->chain_end[i];
          }else{
              row = bfrmm->chain_begin[i];
              }
              chain_if_num = i;
          if(row >= 0){
              if (ifist[row]->bfrmm && iflist[row]->buf_start){
                  bufptr = iflist[row]->buf_start;
                  while (bufptr){
                   if(bufptr->buf && bufptr->buf->compname &&
                   bufptr->buf->bufname){ /* Component Name exists */
              if(dir == 'O'){
                          update_chain( row, iflist[row)->buf_start, iflist);
              }
                      rulptr = bufptr->buf->conn_start;
                          while (rulptr){
                          conn_ln = make_name(row,rulptr->connect_str,iflist,fbptr,bfrmm);
              make_chain_term(conn_ln, row, fbptr,t_attr,dir);
                          rulptr = rulptr->next;
                          }
                       }
                       bufptr = bufptr->next;
                  }
                  }
              }
              }   /* End for loop */
      /* Restore scan_chain_var array */
          for (i=1; i<=chainvars;
              strcpy(scan_chain_var[i],tscan_chain_var[i]);
      }
          chain_if_num = 0;
} /* chain_if */
void make_chain_term(char *conn_ln, int row, FILE *fbptr,
          char *t_attr, char conn)
          {
          char *term_name;
          char *per_loc;
          char new_conn_ln[60] = " ";
          char *colonequals = " := ";
          if (conn_ln && chain num == chain_if_num){
/*              gets(brk); */
/* printf ("chain_num = %i\n", chain_num); */
              if(!strchr(conn_ln,'{')){
              strcat(conn_ln,";");
               term_name = strtok(conn_ln,"=");
               term_name = strtok(NULL,";");
               /* Throw away anything that does not have an = sign */
              if(term_name){
                  if (conn == 'C'){
                      per_loc = strchr(term_name,'.');
                      if(per_loc){
                          *per_loc = '_';
                          fprintf(fbptr," %s : BIT %s;\n",term_name, t_attr);
                      }else{
                          printf("**Error Missing period in connection rule chain
intertace\n");
                          printf(" Scan Position %i. Rule %s\n",row,conn_ln);
                      }
                  }else{
                  strcpy (new_conn_ln,term_name);
                      per_loc = strchr(new_conn_ln,'.');
                      if(per_loc){
                          *per_loc = '_';
                          strcat(new_conn_ln,colonequals);
                          strcat(new_conn_ln,term_name);
                              fprintf(fbptr," %s ;\n",new_conn_ln);
                      }else{
                          printf("**Error Missing period in connection rule chain
interface\n");
                          prntf(" Scan Position %i. Rule %s\n",row,conn_ln);
                      }
                  }
              }
              }
          }
} /* End of make_chain_term */
int check_spreadsheet(ROW *iflist[ ], int slines)
/* This function does initial checks on the spreadsheet struct that has
```

-continued

```
just been read in. Currently it checks to see that all rows are filled
and that there are no duplicate scalar signal names.
*/
{
int i = 0;
int j = 0;
int error_flag = 0;
for(i=0;i<=slines;i++){
        if(iflist[i]==NULL){
                printf("**Error - No scan position %i called out in spreadsheet column %i\n",
                i+1, scan_ord_cl);
        error_flag = 1;
            }
}
for(i=0;i<=slines;i++){
        if (iflist[i]!=NULL && *iflist[i]->bit_no == '\0') {
            for(j=0;j <i;j++){
                if (iflist[j]!=NULL && *iflist[j]->bit_no == '\0') {
                    if(strcmp(iflist[i]->tname,iflist[j]->tname) = 0){
                    printf("**Error* Duplicate scalar terminal names in Rows %i & %i\n",
                    iflist[i]->ssln_no,iflist[j]->ssln_no);
                    printf("Terminal Name = %s\n", iflist[i]->tname);
                    }
                    if (*iflist[i]->input!='\0' && *iflist[j]->input!='\0' &&
                    strcmp(iflist[i]->input,iflist[j]->input) == 0){
                if (strcmp(iflist[i]->bfmm, iflist[j]->bfmm)==0){
                    printf("**Error* Duplicate scalar input names in Rows %i & %i\n",
                    iflist[i]->ssln_no,iflist[j]->ssln_no);
                    printf("Input Name = %s\n", iflist[i]->input);
                    }else{
                    printf("**Warning* Duplicate scalar input names in Rows %i & %i\n",
                    iflist[i]->ssln_no,iflist[j]->ssln_no);
                    printf("Input Name = %s\n", iflist[i]->input);
                }

}
                    if (*iflist[i]->output!='\0' && *iflist[j]->output!='\0' &&
                    strcmp(iflist[i]->output,iflist[j]->output)==0){
                if (strcmp(iflist[i]->bfmm, iflist[j]->bfmm)==0){
                    printf("**Error* Duplicate scalar output naines in Rows %i & %i\n",
                    iflist[i]->ssln_no,iflist[j]->ssln_no);
                    printf("Output Name = %s\n", iflist[i]->output);
                    }else{
                    printf("**Warning* Duplicate scalar output names in Rows %i & %i\n",
                    iflist[i]->ssln_no,iflist[j]->ssln_no);
                    printf("Output Naine = %s\n", iflist[i]->output);
                }
                    }
                }
            }
        }
}
if(error_flag != 0){
        return(1);
}else{
        return(0);
}
}
```

Having thus described the preferred embodiments of the present invention, those of skill in the art will readily appreciate that the teachings found herein may be applied to yet other embodiments within the scope of the claims hereto attached.

What is claimed is:

1. A data processing system for automatically selecting and interconnecting a number of macro cells selected from a component library to form a first circuit design wherein each one of the number of macro cells has a number of terminals, the data processing system comprising:
   a. a user interface for receiving a number of user provided parameters;
   b. storing means for storing a predefined set of circuit design assembly rules;
   c. assembly means coupled to said user interface and to said storing means for assembling the first circuit design in accordance with said number of user provided parameters and said predefined set of circuit design assembly rules;
   d. wherein one or more of the number of macro cells are input macro cells; and
   e. wherein selected ones of the input macro cells include a boundary scan logic module, said boundary scan logic module having a number of terminals.

2. A data processing system according to claim 1 wherein one or more of the number of macro cells are output macro cells.

3. A data processing system according to claim 2 wherein selected ones of the output macro cells comprise a boundary scan logic module, said boundary scan logic module having a number of terminals.

4. A data processing system according to claim 1 wherein one or more of the number of macro cells are bi-directional macro cells.

5. A data processing system according to claim 4 wherein selected ones of the bi-directional macro cells comprise a boundary scan logic module, said boundary scan logic module having a number of terminals.

6. A data processing system according to claim 1 wherein the number of user provided parameters identify one or more of the number of macro cells.

7. A data processing system according to claim 6 wherein the number of user provided parameters includes a number of fixed parameters.

8. A data processing system according to claim 7 wherein one of the number of fixed parameters is a pin location.

9. A data processing system according to claim 7 wherein one of the number of fixed parameters is a signal use.

10. A data processing system according to claim 7 wherein one of the number of fixed parameters is a pin capacitance.

11. A data processing system according to claim 7 wherein one of the number of fixed parameters is a pin resistance.

12. A data processing system according to claim 7 wherein one of the number of fixed parameters specifies a scan order.

13. A data processing system according to claim 6 wherein the number of user provided parameters includes a number of user specified parameters.

14. A data processing system according to claim 13 wherein one of the number of user specified parameters is an input core signal net name.

15. A data processing system according to claim 13 wherein one of the number of user specified parameters is an output core signal net name.

16. A data processing system according to claim 13 wherein one of the number of user specified parameters is a cell name.

17. A data processing system according to claim 13 wherein one of the number of user specified parameters is an associated net.

18. A data processing system according to claim 13 wherein one of the number of user specified parameters specifies a scan order.

19. A data processing system according to claim 13 wherein one of the number of user specified parameters is a test flag.

20. A data processing system according to claim 1 wherein the user interface is a spreadsheet.

21. A data processing system according to claim 20 wherein the spreadsheet provides the user provided parameters to a software program.

22. A data processing system according to claim 1 wherein the assembly means selects the one or more of the number of macro cells that is identified by the user provided parameters and interconnects the number of terminals of each one of the macro cells with one or more of a number of terminals of a second circuit design according to the user provided parameters and the circuit design assembly rules.

23. A data processing system according to claim 22 wherein the second circuit design includes core logic on an integrated circuit die.

24. A data processing system according to claim 22 wherein the assembly means formats the second circuit design into a hardware description language format.

25. A data processing system according to claim 24 wherein the assembly means is a software program which is executed on a workstation.

26. A data processing system according to claim 22 wherein each macro cell comprises a boundary scan logic module, said boundary scan logic module having a number of terminals.

27. A data processing system according to claim 26 wherein one or more of the number of macro cells are input macro cells.

28. A data processing system according to claim 26 wherein one or more of the number of macro cells are output macro cells.

29. A data processing system according to claim 26 wherein one or more of the number of macro cells are bi-directional macro cells.

30. A data processing system according to claim 22 wherein the assembly means interconnects the number of terminals of each one of the one or more of the number of boundary scan logic modules with one or more of the number of terminals of the second circuit design according to a scan order, a particular one of the user provided parameters defining the scan order.

31. A data processing system according to claim 22 wherein each one of the one or more of the number of boundary scan logic modules is compatible with level sensitive scan design requirements.

32. A data processing system according to claim 22 wherein each one of the one or more of the number of boundary scan logic modules is compatible with test access port requirements.

33. A method for automatically selecting and interconnecting a number of macro cells selected from a component library in a data processing system to form a first circuit design wherein each one of the number of macro cells has a number of terminals, comprising the steps of:

a. providing a user interface for receiving a number of user provided parameters;

b. storing a predefined set of circuit design assembly rules;

c. providing a number of user provided parameters to said user interface wherein said number of user provided parameters at least in part identify one or more of the number of macro cells;

d. identifying said one or more of the number of macro cells using said number of user provided parameters;

e. selecting said one or more of the number of macro cells that is identified by said number of user provided parameters, selected ones of the macro cells comprising a boundary scan logic module having a number of terminals;

f. determining a scan order from one or more of said number of user provided parameters to interconnect said number of terminals of the selected ones of the number of boundary scan logic modules; and g. interconnecting said number of terminals of each one of the selected one or more of the number of macro cells with the one or more of said number of terminals of said second circuit design according to the user provided parameters and the circuit design assembly rules.

34. A method according to claim 33 further including the step of formatting the first circuit design into the hardware description language format.

35. A method for automatically selecting and interconnecting a number of macro cells selected from a component library in a data processing system to form a circuit design wherein each one of the number of macro cells has a number of terminals, comprising the steps of:

a. providing a spreadsheet file user interface for receiving a number of user provided parameters;

b. providing a storing means for storing a predefined set of circuit design assembly rules;

c. providing an assembly means for assembling the circuit design into a hardware description language format in accordance with said number of user provided parameters and said predefined set of circuit design assembly rules;

c. storing said predefined set of circuit design assembly rules;

e. providing said number of user provided parameters to said spreadsheet file user interface wherein said number of user provided parameters identifies one or more of the number of macro cells;

f. checking the spreadsheet for said number of user provided parameters which are duplicate or missing;

g. selecting said one or more of the number of macro cells that is identified by said number of user provided parameters, each macro cell comprising a boundary scan logic module having a number of terminals;

h. determining a scan order from one or more of said number of user provided parameters to interconnect selected ones of the number of terminals of each said one of a one or more of a number of boundary scan logic modules; and i. interconnecting selected ones of the number of terminals of each one of said selected one or more of the number of macro cells with said one or more of said number of terminals of said core logic design according to said user provided parameters and said circuit design assembly rules.

* * * * *